United States Patent
Farley et al.

(10) Patent No.: US 6,271,529 B1
(45) Date of Patent: Aug. 7, 2001

(54) ION IMPLANTATION WITH CHARGE NEUTRALIZATION

(75) Inventors: Marvin Farley, Ipswich; Vadim G. Dudnikov, Beverly; Mehran Nasser-Ghodsi, Hamilton, all of MA (US)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/083,707

(22) Filed: May 22, 1998

Related U.S. Application Data

(63) Continuation-in-part of application No. 08/980,509, filed on Dec. 1, 1997, now abandoned.

(51) Int. Cl.$^7$ .............................. H01S 1/00; H01S 3/00; H05H 3/02; H01J 27/00; G21K 5/10
(52) U.S. Cl. ................ 250/492.21; 250/251; 250/423 R; 315/111.81
(58) Field of Search .............................. 250/251, 452.21, 250/423 R; 315/111.81

(56) References Cited

U.S. PATENT DOCUMENTS

| | | |
|---|---|---|
| 3,116,433 | 12/1963 | Moncrieff-Yeates . |
| 3,507,709 | 4/1970 | Bower . |

(List continued on next page.)

FOREIGN PATENT DOCUMENTS

| | | |
|---|---|---|
| 0491311 | 12/1991 | (EP) . |
| 58-80252 | 5/1981 | (JP) . |
| 59-32124 | 2/1984 | (JP) . |
| 4-51443 | 2/1992 | (JP) . |

OTHER PUBLICATIONS

Ito et al., The precision implant 9500 plasma flood system—the advanced solution to wafer charging . . . ; Nuclear Instruments and Methods in Physics Research (1995) 30–33.

Mikhail Nezlin, Physics of Intense Beams in Plasma; Institute of Physics Publishing, Bristol and Philadelphia, p. 78–105, 158–171.

Dudnikov, Vadim G.; Physics and Technology of Ion and Electron Sources; Encyclopedia of Applied Physics, 14:1–33 (1996).

(List continued on next page.)

Primary Examiner—Bruce C. Anderson

(57) ABSTRACT

An ion implanter is provided for implanting ions in a workpiece. The ion implanter includes an apparatus for generating an ion beam and directing it toward a surface of a work piece and a plasma generator for generating plasma to neutralize the ion beam and the work piece surface. The plasma generator has a plasma generator chamber defined by walls, a relatively narrow outlet aperture for plasma produced in the chamber to leave the chamber to neutralize the beam and work piece surface, cathodes, and anodes spaced from the cathodes and from the walls of the chamber. The plasma generator also has magnets arranged within the plasma generator chamber, adjacent the chamber walls to generate a magnetic field to deflect primary electrons emitted from the cathode from directly reaching the anode. The plasma generator also features a conductive shield, positioned within the chamber between the anode and the magnets, the shield having an electric potential selected to deflect electrons, the magnetic field and the conductive shield effective during operation to cause electrons from the cathode to trace extended paths to ionize gas within the chamber to generate plasma before reaching the anode. A drift tube defined by walls through which the ion beam passes before reaching the workpiece is opened into by the aperture opens into the tube. A series of parallel, linear magnets are positioned perpendicular to the general path of the ion beam. The adjacent poles of adjacent magnets are of opposite polarity.

30 Claims, 19 Drawing Sheets

U.S. PATENT DOCUMENTS

| | | |
|---|---|---|
| 3,657,542 | 4/1972 | Futch, Jr. et al. . |
| 3,970,892 | 7/1976 | Wakalopulos . |
| 4,045,677 | 8/1977 | Humphries, Jr. et al. . |
| 4,101,765 | 7/1978 | Hooper, Jr. . |
| 4,179,615 | 12/1979 | Kraus et al. . |
| 4,247,781 | 1/1981 | Bayer et al. . |
| 4,249,077 | 2/1981 | Crawford . |
| 4,276,477 | 6/1981 | Enge . |
| 4,351,712 | 9/1982 | Cuomo et al. . |
| 4,361,762 | 11/1982 | Douglas . |
| 4,377,773 | 3/1983 | Hershcovitch et al. . |
| 4,401,054 | 8/1983 | Matsuo et al. . |
| 4,419,203 | 12/1983 | Harper et al. . |
| 4,438,368 | 3/1984 | Abe et al. . |
| 4,463,255 | 7/1984 | Robertson et al. . |
| 4,530,734 | 7/1985 | Klima . |
| 4,587,430 | 5/1986 | Adler . |
| 4,713,542 | 12/1987 | Campana . |
| 4,727,293 | 2/1988 | Asmussen et al. . |
| 4,728,862 | 3/1988 | Kovarik et al. . |
| 4,733,091 | 3/1988 | Robinson et al. . |
| 4,742,232 | 5/1988 | Biddle et al. . |
| 4,745,287 | 5/1988 | Turner . |
| 4,749,911 | 6/1988 | Wakalopulos et al. . |
| 4,749,912 | 6/1988 | Hara et al. . |
| 4,760,262 | 7/1988 | Sampayan et al. . |
| 4,783,597 | 11/1988 | Misawa et al. . |
| 4,803,503 | 2/1989 | Mayer . |
| 4,804,852 | 2/1989 | Rose et al. . |
| 4,806,829 * | 2/1989 | Nakao ................................. 250/251 |
| 4,825,087 | 4/1989 | Renau et al. . |
| 4,831,963 | 5/1989 | Saito et al. . |
| 4,838,021 | 6/1989 | Beattie . |
| 4,841,197 | 6/1989 | Takayama et al. . |
| 4,862,032 | 8/1989 | Kaufman et al. . |
| 4,873,445 * | 10/1989 | Le Jeune ............................. 250/251 |
| 4,874,947 | 10/1989 | Ward et al. . |
| 4,886,971 | 12/1989 | Matsumura et al. . |
| 4,899,057 | 2/1990 | Freytsis et al. . |
| 4,904,902 | 2/1990 | Tamai et al. . |
| 4,914,292 | 4/1990 | Tamai et al. . |
| 4,916,311 * | 4/1990 | Fuzishita et al. .................... 250/251 |
| 4,922,106 | 5/1990 | Berrian et al. . |
| 4,950,956 | 8/1990 | Asamaki et al. . |
| 4,960,073 | 10/1990 | Suzuki et al. . |
| 4,967,078 | 10/1990 | Purser . |
| 5,003,183 | 3/1991 | Nogami et al. . |
| 5,008,226 | 4/1991 | Taylor et al. . |
| 5,025,194 | 6/1991 | Menet et al. . |
| 5,032,202 | 7/1991 | Tsai et al. . |
| 5,046,148 | 9/1991 | Nogami et al. . |
| 5,053,627 | 10/1991 | Ruffell et al. . |
| 5,068,539 | 11/1991 | Nogami et al. . |
| 5,072,125 | 12/1991 | Nakanishi et al. . |
| 5,089,710 | 2/1992 | Kikuchi et al. . |
| 5,113,074 | 5/1992 | Sferlazzo . |
| 5,122,251 | 6/1992 | Campbell et al. . |
| 5,125,358 | 6/1992 | Ueda et al. . |
| 5,133,825 | 7/1992 | Hakamata et al. . |
| 5,134,299 | 7/1992 | Denholm . |
| 5,136,171 | 8/1992 | Leung et al. . |
| 5,136,211 | 8/1992 | Kaufman et al. . |
| 5,144,196 | 9/1992 | Gegenwart et al. . |
| 5,162,699 | 11/1992 | Tokoro et al. . |
| 5,164,599 | 11/1992 | Benveniste . |
| 5,189,446 | 2/1993 | Barnes et al. . |
| 5,256,947 | 10/1993 | Toy et al. . |
| 5,262,652 | 11/1993 | Bright et al. . |
| 5,274,306 | 12/1993 | Kaufman et al. . |
| 5,278,420 | 1/1994 | Sugiyama . |
| 5,300,891 | 4/1994 | Tokoro . |
| 5,306,922 | 4/1994 | O'Connor . |
| 5,311,028 | 5/1994 | Glavish . |
| 5,319,212 | 6/1994 | Tokoro . |
| 5,326,981 | 7/1994 | Hara et al. . |
| 5,352,899 | 10/1994 | Golovanivsky et al. . |
| 5,384,465 | 1/1995 | Armour et al. . |
| 5,393,984 | 2/1995 | Glavish . |
| 5,399,871 * | 3/1995 | Ito et al. ............................. 250/251 |
| 5,406,088 | 4/1995 | Brune et al. . |
| 5,422,490 | 6/1995 | Nakamura et al. . |
| 5,432,342 * | 7/1995 | Nishimura et al. .................. 250/251 |
| 5,438,238 | 8/1995 | Toy et al. . |
| 5,440,132 | 8/1995 | Joyner et al. . |
| 5,442,185 | 8/1995 | Chan . |
| 5,449,920 | 9/1995 | Chan . |
| 5,468,955 | 11/1995 | Chen et al. . |
| 5,486,702 | 1/1996 | O'Connor et al. . |
| 5,504,340 | 4/1996 | Mizumura et al. . |
| 5,576,600 | 11/1996 | McCrary et al. . |
| 5,583,344 | 12/1996 | Mizumura et al. . |
| 5,668,368 * | 9/1997 | Sakai et al. ......................... 250/251 |
| 5,703,375 * | 12/1997 | Chen et al. ......................... 250/251 |
| 5,750,987 * | 5/1998 | Ichimura et al. .................... 250/251 |

OTHER PUBLICATIONS

Ito et al., Plasma Flood System –Physics of Low Energy Electron Generation, Plasma Coupling, Electron Transport and Surface Charge Neutralization on Wafer; IEEE pp. 432–435 (1997).

Ray et al., Overview of the Eaton NV–8200P high beam purity, parallel scanning implanter; Ion Implantation Technology—92 (1993).

Foad, M.A., et al., Beam Current and Source Life Enhancement of the Bernas Ion Source for the Precision Implant 9500xR and xR80; 1997 IEEE, 424–427.

Vella, M.C., et al., Bernas Source for the Precision Implant 9200; 1997 IEEE, 394–395.

Renau, A., et al., A Novel Ion Source For High Current Ion Implantation; 1997 IEEE, 279–282.

Kellerman et al., Two–Dimensional Beam Plasma Parameter Maps for Secondary Electron, . . . ; 1997 IEEE, 360–363.

S. Moffatt, Nucl. Inst. Methods, B96, 1 (1995); Ion implantation from the past and into the future.

A.T. Forrester, Propagation of High Poissance Beams; Large Ion Beams (Wally, 1987).

Tom Green; Reflections (invited); Rev. Sci. Instrum., 61(1), 665 (1990).

Smatlak et al., Charge neutralization in ion implanters; Nuclear Instruments and Methods in Physics Research (1995) 22–29.

Current et al., Beam–plasma Concepts for Wafer Charging Control During Ion Implantion; 1997 IEEE, pp. 53–56.

G. Ryding et al., The Ibis 1000 SIMOX Production Implanter; 1997 IEEE 436–439.

Soloshenko, Production and Neutralization of Negative Ions and Beams; American Institute of Physics, pp. 345–363 (1996).

Sherman et al., H–Beam Neutralization Measurements in A Solenoidal Beam Transport System; American Institute of Physics, pp. 686–694 (1994).

Lazarski et al., A Mechanical Sample Sweeping System for Large Surface Irradiation; Nuclear Instruments and Methods 113:303–304 (1973).

Ryding, G. et al., Beam Measurement and Dose Control In a High Current Implanter.

Bacal, "Volume Productiion of Hydrogen Negative Ions", Nuclear Instruments and Methods in Physics Research B37/38:28–32, 1989.

Belchenko et al., "Ion Sources at the Novosibirsk Institute of Nuclear Physics (invited)", Rev. Sci. Instrum. 61:378–384, 1990.

Boukari et al., "A Compact Electron Cyclotron Resonance Proton Ion Source", Rev. Sci. Instrum. 67:994–996, 1996.

Budker, "An Effective Method of Damping Particle Oscillations in Proton and Antiproton Storage Rings", Sou. Atomic Energy 438–448.

Chen, "Experiments on Helicon Plasma Sources", J. Vac. Sci. Technol. A10(4):1389–1401, 1992.

Dudnikov et al., "Transverse Instability in the Proton Storage Ring Induced by Negative Ions", Int. J. Mod. Phys. A (Proc. Suppl.) 2B(1993), HEACC'92 Hamburg XVth Int'l Conf. High Energy Acc. 1025–1027, 1992.

England, "Charged Particle Energy Spectrometers and Their Applications in Fundamental Studies of Wafer Charging . . . ", Nuclear Instruments & Methods in Physics Research, B96:39–42, 1995.

Freeman et al., "Invited Review Article Canal Rays to Ion Implantation: 1886–1986", Radiation Effects 100:161–248, 1986.

Gryzinski, "Two–Particle Collisions. I. General Relations for Collisions in the Laboratory System", Physical Review 138:A305–A321, 1965.

Zelenski et al., "Pulsed Optically Pumped Polarized H– ion Source Development", Rev. Sci. Instrum. 67:1359–1361, 1996.

Holmes, "Beam Transport", Radiation Effects 44:47–58, 1979.

Holmes, "Theoretical and Experimental Study of Space Charge in Intense Ion Beams", Physical Review A 19:389–407, 1979.

Hutchinson, "Principles of Plasma Diagnostics", Cambridge University Press, Contents 284–328, 1987.

Kelleman et al., "Measurements of Charge Neutralization Due to Photoresist Outgassing", Ion Implantation Technology 94:604–607, 1995.

Leung, "Development of High Current and High Brightness Negative Hydrogen Ion Sources", Nuclear Instruments and Methods in Physics Research B37/38:33–37, 1989.

Lukaszek et al., "Characterization and Control of Wafter Charging Effects During High–Current Ion Implantation", Lawrence Berkeley Laboratory Univ. of California UC–406, 1–12, 1994.

Lukaszek et al., "Measurement of Process Induced Wafer Potentials"; Ion Implantation Technology (1993) p. 645–650.

Mack, "Wafer Cooling and Wafer Charging in Ion Implantation", Handbook of Ion Implantation Technology pp. 599–646, 1992.

Moffatt, "Ion Implantation From the Past and Into the Future", Nuclear Instruments and Methods in Physics Research B96:1–6, 1995.

Popov et al., "A Compact Electron Cyclotron Resonance Source for 200–2000 eV Ion Beams", Plasma Sources Sci. Technol. 3:453–459, 1994.

Stevens, "Electron Cyclotron Resonance Plasma Sources", High Sensity Plasma Sources Design, Physics and Performance p. v and 312–379, 1995.

Chen, "Helicon Plasma Sources", High Density Plasma Sources Design, Physics and Performance p. v, 1–75, 1995.

High Density Plasma Sources Design, Physics and Performance, Table of Contents pp. v, and xv–xx, 1995.

Simonton, "Ion Source Operation and Maintenance In a Semiconductor Production Environment", Handbook of Ion Implantation Technology, 502–554, 1992.

White, "Section IV. Innovations in Ion Source and Beam Transport", Nuclear Instruments and Methods in Physics Research B55:287–295, 1991.

Vella et al., "Plasma Flood System for the Precision Implant 9200", IEEE 428–431, 1997.

Kikuchi et al., "A New Technique for Wafer Charge Neutralization for High Current Ion Implanters", Ion Implantation Technology 1993, p. 641–644.

Lukaszek et al., "Charging studies with CHARM"; Nuclear Instruments and Methods in Physics Research B55 (1991) p. 143–147.

Lukaszek et al., Charging studies using the CHARM2 wafer surface charging monitor; Nuclear Instruments and Methods in Physics Research B74 (1993) 301–305.

Malone et al., Studies of wafer surface charging using the THOR monitor device; Nuclear Instruments and Methods in Physics Research B96 (1995) p. 52–55.

Current et al., "Surface charge control during high–current ionimplantation: characterization with CHARM–2 sensors"; Nuclear Instruments and Methods in Physics Research 96 (1995) 34–38.

Lukaszek et al., "Characterization of Wafer Charging Mechanisms . . . "; 1994 IEEE.

Asmussen, Jes; "Electron cyclotron resonance microwave discharges for etching and thin–film deposition"; Journal of Vacuum Science & Technology A; vol. 7, May/Jun. 1989.

Mack et al., "Particle generation in ion implanters" Nuclear Instruments and Methods in Physics Research B96 (1995) 80–86.

Torii et al., "Advanced high–current ECR ion sources for implanters", Rev. Sci. Instrum. 63(4), Apr. 1992; American Institute of Physics.

Dimov et al., "Investigation of the effect of secondary–charges particles . . . ", Soviet Atomic Energy vol. 29, Nov. 1970, p. 1100–1106.

* cited by examiner

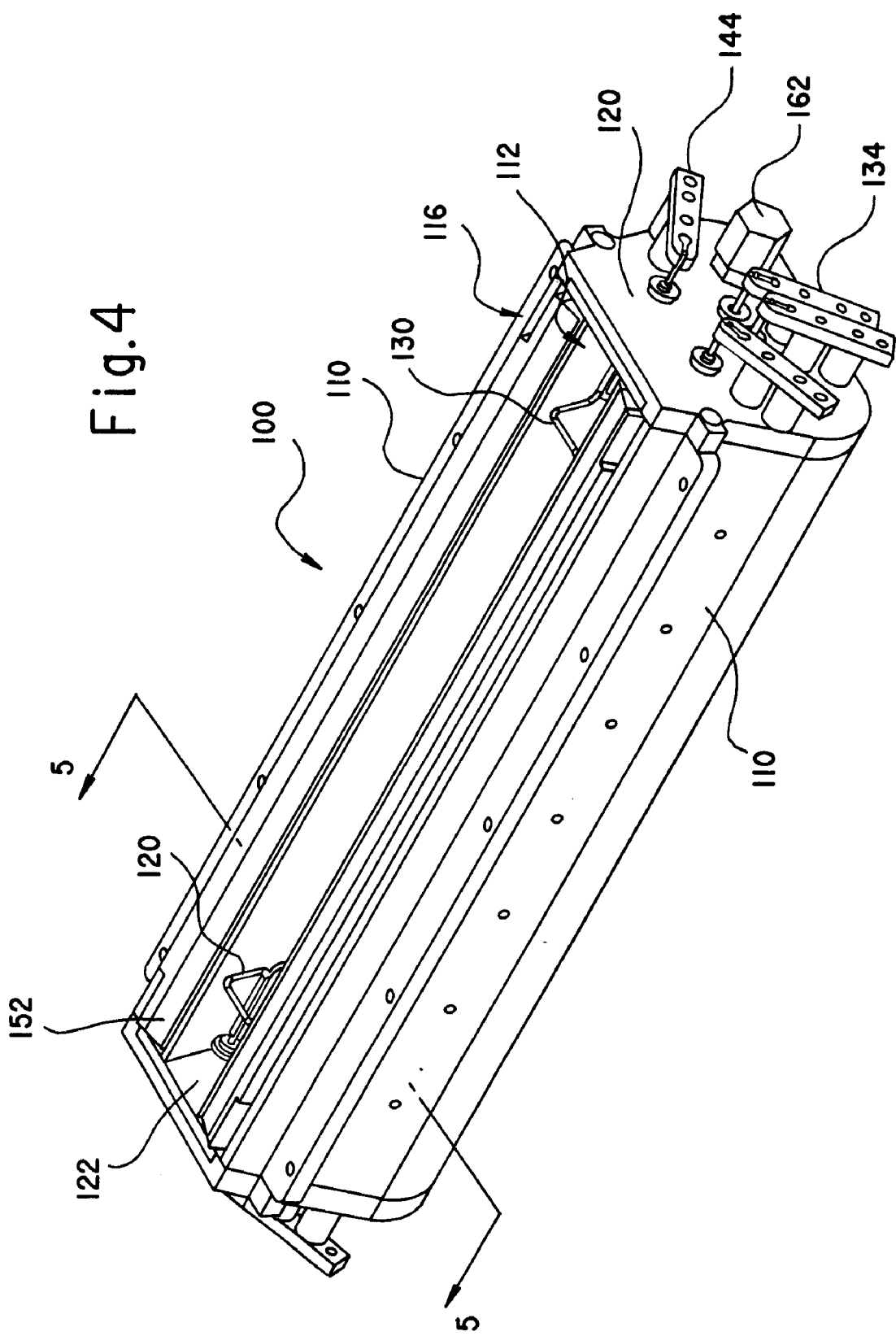

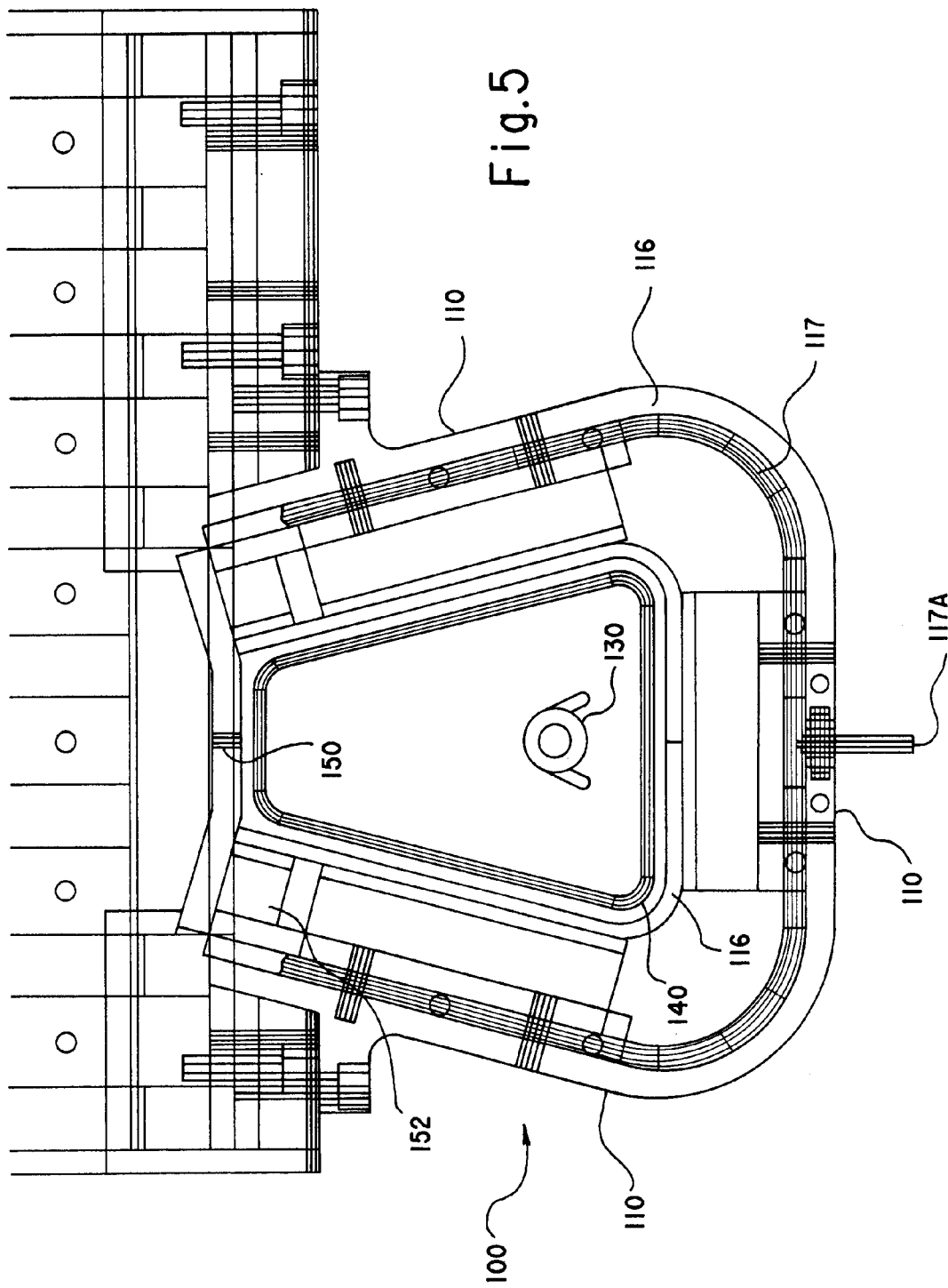

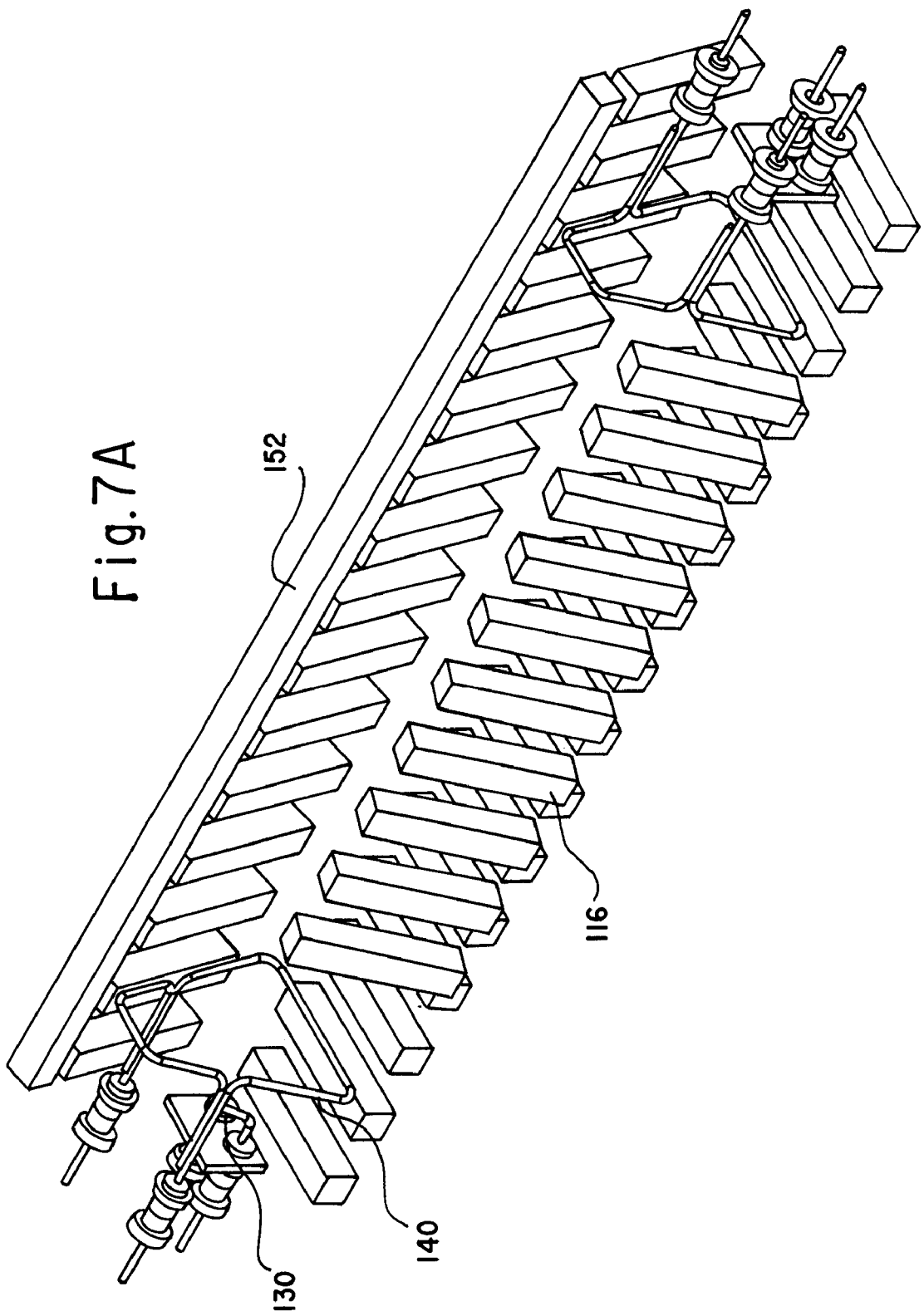

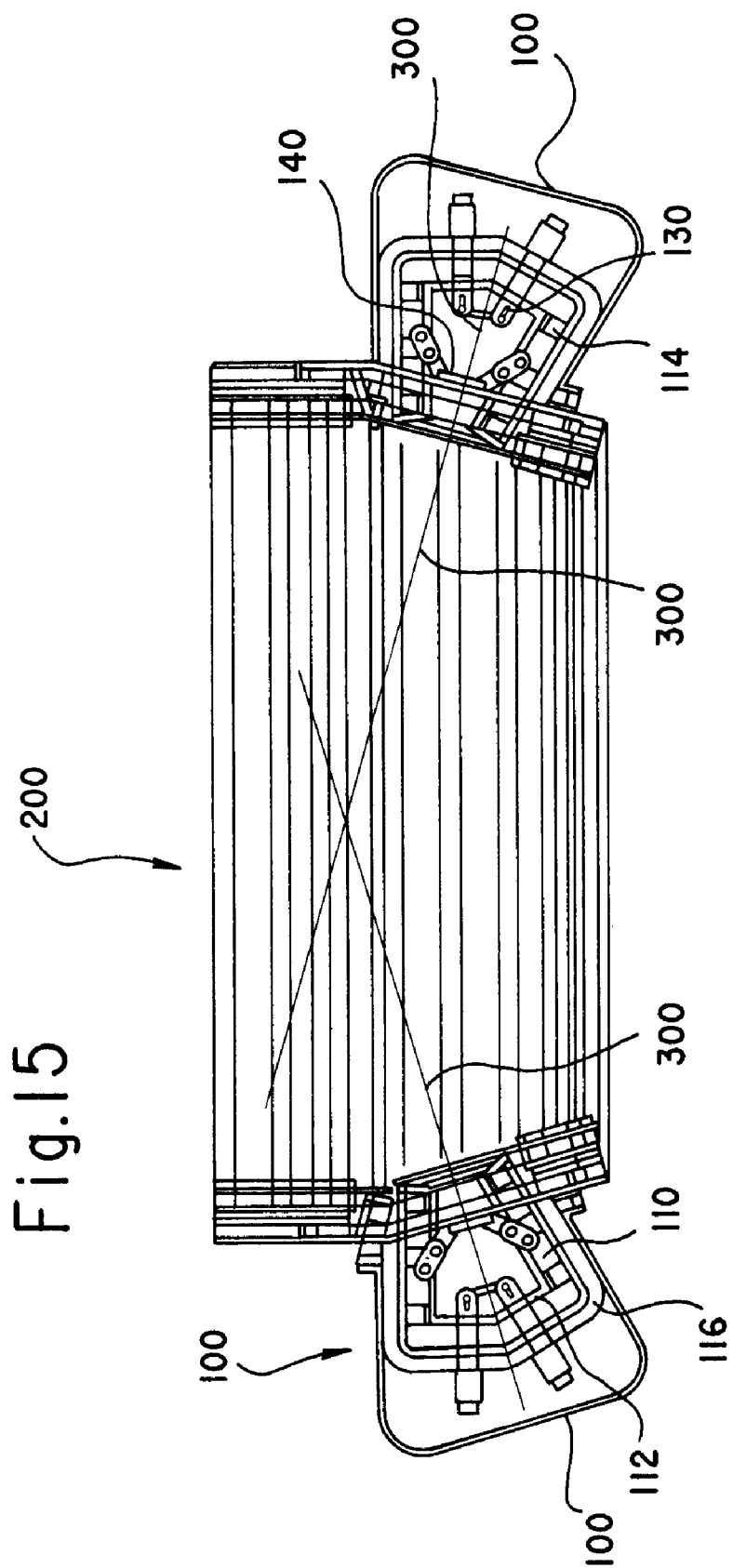

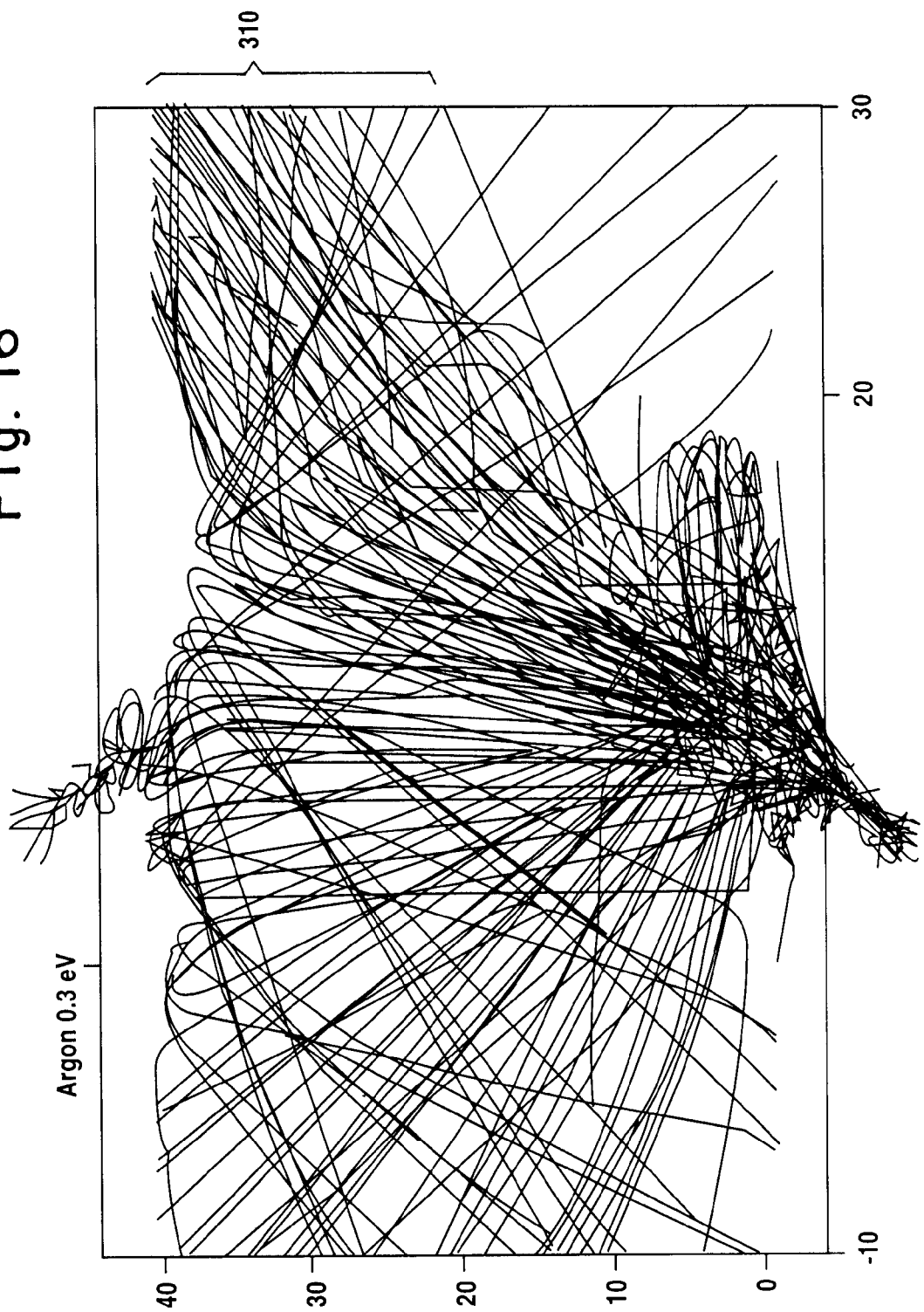

ION IMPLANTATION WITH CHARGE NEUTRALIZATION

CROSS REFERENCE TO RELATED APPLICATIONS

This application is a continuation-in-part of application Ser. No. 08/980,509, filed Dec. 1, 1997, abandoned.

This application is related to the commonly assigned applications "Ion source", filed herewith today, U.S. Ser. No. 09/083,814, "Transmitting a Signal Using Duty Cycle Modulation", filed Dec. 1, 1997, Ser. No. 08/982,210, and "Space Charge Neutralization of an Ion Beam", filed herewith today, Ser. No. 09/083,707, each of which is incorporated by reference in its entirety.

BACKGROUND

This invention relates to ion implantation.

As is well known, ion implantation is a process of generating an ion beam, focusing that beam, and directing it toward a wafer to implant ions into the wafer.

As fast moving particles in an ion implanter collide with the residual gas and the walls of the implanter, they generate low energy ions and free electrons. A positively charged ion beam traps these electrons and simultaneously rejects the positive ions. The positive ion beam has an inherent potential that is typically distributed nonuniformly across the beam cross-section. (The inherent potential of the beam is also known as the space charge of the beam.)

When the ion beam strikes the wafer surface, low energy electrons are emitted and the wafer tends to become positively charged. Generally, the net amount of positive charge delivered to the wafer is directly proportional to the beam current. In the case of a high current beam, the positive charge on the wafer tends to become quite high - in tens of volts.

When the wafer surface is well grounded to the vacuum enclosure and free of dielectric layers, the charge mainly flows to ground. However, ions are typically implanted after one or more dielectric layers have already been formed on the surface. These layers act as isolated islands on which the ion beam creates electrostatic charge.

The charge build up creates problems. The electrostatic charge interacts with the beam and causes it to lose density, which is a disadvantage because variations in ion beam density results in a nonuniform implantation process. Also, electrostatic charge may discharge and destroy the already formed dielectric layers. With smaller size integrated circuits, the susceptibility of dielectric layers to destruction by such discharge increases. Hence, there is low tolerance for surface charge buildup during ion implantation process.

A solution to these problems is to introduce a neutralizing charge, e.g electrons, to the surface of the wafer and/or to the beam before it contacts the wafer. One implementation of this method is to use a so-called electron shower to supply the neutralizing charge. Another is to use plasma-generating sources to supply low energy electrons and positive ions. Both of these methods typically apply the neutralizing charge near where the beam contacts the wafer.

Electron showers, however, typically supply a large number of high energy electrons which themselves contribute to charging of the wafer surface.

Plasma sources, which typically supply a higher proportion of low energy electrons and ions than do electron showers, not only better neutralize the beam and the surface charge but also contribute less to negative charge buildup on the wafer. When using a plasma source, however, a large plasma density is required to neutralize the beam. The required density can increase the pressure in the vacuum enclosure and degrade the efficiency of the implantation process. Moreover, a uniform and dense plasma is necessary. This is a particularly stringent requirement in respect of scanned beams, because of the wide scanning path. In the case of high current, magnetically scanned beams, the scanning area can be quite large, e.g. approximately 400 mm ×100 mm.

SUMMARY

In one general aspect, the invention features an ion implanter for implanting ions in a workpiece. The ion implanter includes an apparatus for generating an ion beam and directing it toward a surface of a work piece. The ion implanter also includes a plasma generator for generating plasma to neutralize the ion beam and the work piece surface, where the plasma generator has a plasma generator chamber defined by walls, a relatively narrow outlet aperture for plasma produced in the chamber to leave the chamber to neutralize the beam and work piece surface, at least one cathode, and at least one anode spaced from the cathode and from the walls of the chamber. The plasma generator also has magnets arranged within the plasma generator chamber, adjacent the chamber walls to generate a magnetic field to deflect primary electrons emitted from the cathode from directly reaching the anode. The plasma generator also features a conductive shield, positioned within the chamber between the anode and the magnets, the shield having an electric potential selected to deflect electrons, the magnetic field and the conductive shield effective during operation to cause electrons from the cathode to trace extended paths to ionize gas within the chamber to generate plasma before reaching the anode.

Preferred embodiments of this aspect of the invention may include one or more of the following features.

The ion implanter can be for use with a scanned ion beam, and its chamber and its outlet aperture being elongated and arranged across a scanned path of the beam.

The apparatus for generating and directing the ion beam includes a magnetic scanner and the ion beam is a high energy beam.

The cathode is a spiral coil and the anode is in a generally surrounding relationship with the cathode. The implanter also has a second anode and cathode. The magnets of the plasma generator generate a magnetic cusp field that generally contains the plasma along an axis connecting the cathodes.

The chamber comprises a wall onto which the cathode is mounted and the wall has substantially the same potential as the cathode so as to deflect electrons from the wall.

Other magnets surround the relatively narrow outlet aperture and the other magnets create a magnetic field for preventing primary electrons from leaving the chamber.

The chamber has a generally trapezoidal cross-section and the relatively narrow outlet aperture is located at a narrow end of the trapezoid. The relatively narrow outlet aperture is a discontinuous slit. Two magnets are located at either side of the relatively narrow outlet aperture and the two magnets either create a magnetic field for preventing primary electrons from leaving the chamber.

The chamber includes a wall opposing the cathode, and the magnets comprise a series of linear magnets disposed in parallel and inside of the chamber walls, a side facing inside the chamber and an opposing side facing outside having opposite polarity. The adjacent magnets are of opposite polarity and are sized and arranged in a pattern along the tube to create a magnetic field that generally contains the plasma along an axis between the cathode and the opposing wall.

A second anode and cathode are positioned on the opposing wall. The chamber walls are cooled. The chamber walls are water-cooled.

A drift tube defined by walls through which the ion beam passes before reaching the workpiece is opened into by the aperture opens into the tube. A series of parallel, linear magnets are positioned perpendicular to the general path of the ion beam. The magnets have a side facing the beam and an opposing side facing away from the beam, the two sides of the magnets having opposite polarity. The adjacent poles of adjacent magnets are of opposite polarity and the magnets are sized and arranged in a pattern along the tube to create a magnetic field that prevents the plasma from reaching the walls of the drift tube and to enable any deflection of the ion beam produced by one magnet pole to be substantially neutralized by the successive magnet pole of the next adjacent downstream magnets.

The drift tube has generally a rectangular cross-section and allows for a beam scanning path in order of 40 cm. The conductive shield is constructed from graphite.

The plasma generator is tilted relative to a general path of the beam. The plasma generator is characterized by a discharge axis defining an axis of discharge of plasma from the plasma generator and the discharge axis is either perpendicular to a general path of a beam or at an angle to a general path of a beam. The discharge axis may be tilted toward the wafer.

The ion implanter may be for use with a scanned ion beam and the chamber and its outlet aperture are arranged perpendicular to a scanned path of the beam. A drift tube defined by walls through which the ion beam passes before reaching the workpiece is opened into by the aperture. The drift tube has generally a rectangular cross-section and the chamber and its outlet aperture are arranged along a short side of the drift tube. A series of parallel, linear magnets are positioned perpendicular to the general path of the ion beam. The magnets have a side facing the beam and an opposing side facing away from the beam, the two sides of the magnets having opposite polarity. Adjacent poles of adjacent magnets are of opposite polarity. The magnets are sized and arranged in a pattern along the tube to create a magnetic field that prevents the plasma from reaching the walls of the drift tube and to enable any deflection of the ion beam produced by one magnet pole to be substantially neutralized by the successive magnet pole of the next adjacent downstream magnets.

In another general aspect, the invention features an ion implanter for implanting ions in a workpiece. The ion implanter includes an apparatus for generating an ion beam and directing it toward a surface of a work piece. The ion implanter further includes a drift tube defined by walls through which the ion beam passes before reaching the workpiece. The invention also includes a plasma generator for generating plasma to neutralize the ion beam and the work piece surface. The plasma generator has an aperture for the generated plasma to leave the plasma generator to neutralize the beam. The aperture opens into the tube. A series of parallel, linear magnets are positioned perpendicular to the general path of the ion beam. The magnets have a side facing the beam and an opposing side facing away from the beam. The two sides of the magnets have opposite polarity. Adjacent poles of adjacent magnets are of opposite polarity and the magnets are sized and arranged in a pattern along the tube to create a magnetic field that prevents the plasma from reaching the walls of the drift tube and to enable any deflection of the ion beam produced by one magnet pole to be substantially neutralized by the successive magnet pole of the next adjacent downstream magnets.

Preferred embodiments of this aspect of the invention includes may include one or more of the following features.

The plasma generator may be an electron cyclotron resonance (ECR) plasma source. The drift tube has generally a rectangular cross-section and the electron cyclotron resonance (ECR) plasma source is arranged along a short side of the drift tube. A second electron cyclotron resonance (ECR) plasma source may be arranged along another short side of the drift tube.

In yet another aspect, the invention features a plasma generator for generating plasma to neutralize an ion beam and a work piece surface. The plasma generator a plasma generator chamber defined by walls and a relatively narrow outlet aperture for plasma produced in the chamber to leave the chamber to neutralize the beam and work piece surface. The plasma generator also includes at least one cathode and at least one anode spaced from the cathode and from the walls of the chamber. Magnets are arranged within the walls to generate a magnetic field that deflects primary electrons emitted from the cathode from directly reaching the anode. The plasma generator further includes a conductive shield, positioned within the chamber between the anode and the magnets. The shield has an electric potential selected to deflect electrons. The magnetic field and the conductive shield are effective during operation to cause electrons from the cathode to trace extended paths to ionize gas within the chamber to generate plasma before reaching the anode.

In still another aspect, the invention features an ion implanter for implanting ions in a workpiece using a magnetically scanned ion beam. The ion implanter includes an apparatus for generating an ion beam and directing it toward a surface of a work piece, a plurality of magnets to focus and scan the ion beam in a first direction, and a workpiece holder to hold the workpiece and to move the workpiece in a second direction substantially perpendicular to the first direction. The ion implanter also includes a plasma generator for generating plasma to neutralize the ion beam and the work piece surface, the plasma generator. The ion implanter also includes a plasma generator for generating plasma to neutralize the ion beam and the work piece surface, where the plasma generator has a plasma generator chamber defined by walls, a relatively narrow outlet aperture for plasma produced in the chamber to leave the chamber to neutralize the beam and work piece surface, at least one cathode, and at least one anode spaced from the cathode and from the walls of the chamber. The plasma generator also has magnets arranged within the plasma generator chamber, adjacent the chamber walls to generate a magnetic field to deflect primary electrons emitted from the cathode from directly reaching the anode. The plasma generator also features a conductive shield, positioned within the chamber between the anode and the magnets, the shield having an electric potential selected to deflect electrons, the magnetic field and the conductive shield effective during operation to cause electrons from the cathode to trace extended paths to ionize gas within the chamber to generate plasma before reaching the anode. The ion implanter further includes a drift tube defined by walls through which the ion beam passes before reaching the workpiece. The invention also includes a plasma generator for generating plasma to neutralize the ion beam and the work piece surface. The plasma generator has an aperture for the generated plasma to leave the plasma generator to neutralize the beam. The aperture opens into the tube. A series of parallel, linear magnets are positioned perpendicular to the general path of the ion beam. The magnets have a side facing the beam and an opposing side facing away from the beam. The two sides of the magnets have opposite polarity. Adjacent poles of adjacent magnets are of opposite polarity and the magnets are sized and arranged in a pattern along the tube to create a magnetic field that prevents the plasma from reaching the walls of the drift tube and to enable any deflection of the ion beam produced by one magnet pole to be substantially neutralized by the successive magnet pole of the next adjacent downstream magnets.

Embodiments of the invention may include one or more of the following advantages.

The invention, in certain embodiments, allows the beam to be neutralized without the plasma having to flow to any potential other than ground, so that more of the implanter can reside at ground potential.

The invention, in certain embodiments, can operate over a very wide range of beam potential, e.g. from 1 keV up to 100 keV.

The invention in certain embodiments allows low energy positive ions and electrons to drift into the path of the beam and be trapped within the beam so as to neutralize the beam.

The plasma source can have a high plasma production efficiency.

The plasma source and the drift tube can generate a uniform and dense plasma along the length of and across the scanning area.

The plasma source can have a long life because arc current between a cathode and the walls of the source can be reduced.

The beam can be only minimally deflected from its path in the drift tube due to the presence of the charge neutralizer.

Some implanters using the invention for space charge neutralization can be specially suited for implanting wafers with characteristic requirements of ULSI circuits. Specifically, these circuits, because of the density of the structures on them, are sensitive to uniformity, charging, and particulates. These invention can reduce deflection of the ion beam and lessen the increase in the gas pressure in the ion implanter and therefore increases uniformity. The invention also can provide good charge neutralization which reduces the possibility of gate destruction on the wafer and therefore increases the yield on the wafer. Moreover, the invention can feature low production of particulate in the ion source reduces the contamination due to production of particulate in the ion implanter.

BRIEF DESCRIPTION OF THE DRAWING

FIG. 4 is a perspective view of the plasma source of FIGS. 2 and 3 with the drift tube removed.

FIG. 5 is a cross-section of the plasma charge neutralizer taken on line 5—5 of FIG. 4 with part of the drift tube shown.

FIGS. 7 and 7A are perspective views from different vantage points of the arrangement of magnets surrounding the plasma source and their relative position to anode of the source.

FIG. 15 shows another embodiment of a plasma charge neutralizer.

FIG. 16 shows results of a simulation of the operation of an alternative embodiment of a plasma charge neutralizer.

DESCRIPTION

Briefly stated, to neutralize an ion beam, a plasma source generates a plasma by ionizing a gas—typically an inert gas such as argon, xenon, or krypton. According to certain embodiments of the invention, a cathode and anode pair is located at each end of a plasma source chamber that extends across a wide section of a drift tube sized and shaped to pass a scanned beam. A power supply drives each cathode so that it is heated to a temperature to thermionically emit electrons. We refer to electrons having energy corresponding to the cathode potential as "primary electrons." Electrons emitted from the cathodes are primary electrons. Positively charged plasma and anodes in the source extract more primary electrons from the heated cathodes. These primary electrons interact with the neutral gas to ionize it and create the plasma. A combination of a cusped magnetic field and an electrical field in the plasma source prevents these primary electrons from being absorbed by the anode and the walls of the source. As a result, the primary electrons oscillate between the two ends of the plasma source, effectively tracing an extended path to interact for a prolonged time with the neutral gas. This prolonged interaction increases the efficiency of plasma production. Because the electrons are deflected and reflected toward the middle of the plasma source, plasma production is distributed (not limited to the areas around the cathode and the anode) and can have a high degree of uniformity along the length of the source.

The plasma, consisting of low energy electrons and low energy positive ions, generated in the source drifts through an aperture into a drift tube. A magnetic trap provided by a cusped magnetic field contains this plasma in close proximity to the beam. Some of the low energy electrons and positive ions are then trapped in the beam and tend to neutralize the overall potential of the beam. The magnetic trap tends to maintain the density of the plasma to reduce the pressure-rise effects of the plasma on the vacuum environment in the ion implanter. Furthermore, the magnetic trap of the drift tube reflects the low energy electrons and positive ions toward the wafer so that any charge build up on the wafer can be neutralized. The cusped magnetic field of the magnetic trap is provided in a pattern that minimizes the deflection of the beam due to the magnetic field itself.

We will first briefly describe the structure of an exemplary ion implanter with which the plasma charge neutralizer of this invention may be employed. We will then describe the structure of a plasma charge neutralizer according to the invention, by describing the structure of the plasma source and drift tube which together make up the plasma charge neutralizer. We will then describe the operation of the plasma charge neutralizer, and then suggest some of the alternate ways in which some extra features of the invention may be employed.

Figure 1:
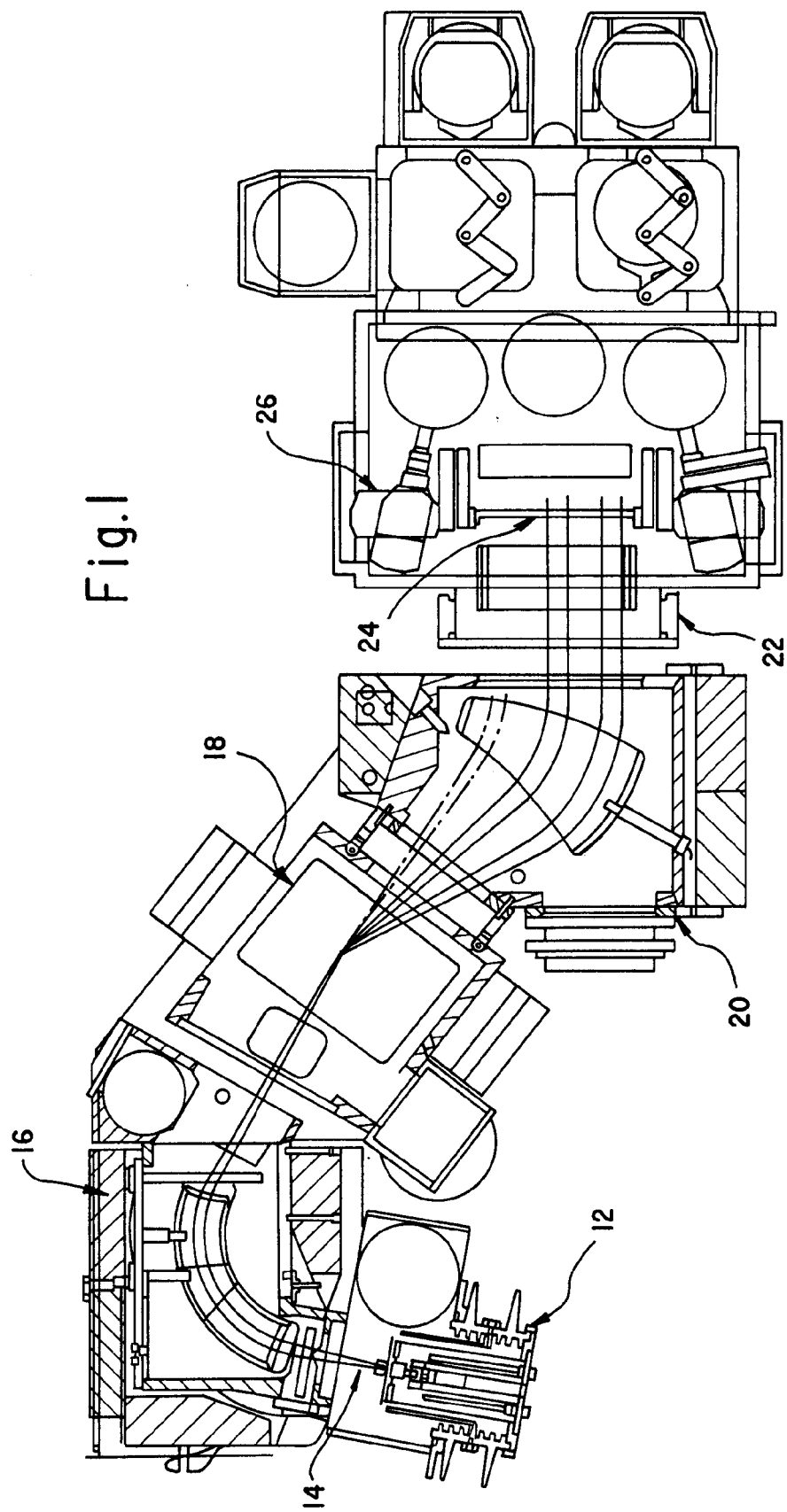
FIG. 1 is a plan view of an ion implanter and its beam path.

FIG. 1 shows an example of an ion implanter 10 in which the plasma charge neutralizer of this invention may be used. General features of such an ion implanter is disclosed in e.g. U.S. Pat. No. 5,393,984, hereby incorporated by reference.

Ion implanter 10 is composed of an ion source 12, an extractor electrode 14, an analyzer magnet 16, a scanner magnet 18, a collimator magnet 20, a plasma charge neutralizer 22 and a wafer 24. Generally, ion implanter 10 produces a ribbon-shaped beam which in some embodiments has a range of energies from 1 keV to 100 keV. The beam is a high current, high perveance beam (in some embodiments the beam has a perveance in the order of or greater than $0.02(mA)(amu)^{1/2} (KeV)^{-3/2}$), as explained in the referenced patent. The beam is magnetically scanned over the wafer in one direction. The wafer may also be moved in another direction to enable scanning in a second direction.

Ion source 12 of the implanter may be any type of ion generating source, including a Bernas type source, a Freeman source or a microwave ECR source. Ion source 12 generates positively charged ions for implantation, including gases such as argon, nitrogen, disassociated boron (as in BF3), arcin, and phosphine. Solids may also be implanted after vaporization. Such solids include phosporus, arsenic, and antimony. Other material may also be implanted. The ions emerge from an orifice, extracted by extraction electrode 14, which has a negative potential compared to the source. The shape and position of extractor electrode 14 is such that a well-defined ion beam emerges from the electrode.

Analyzer magnet 16 then analyzes the ion beam by removing undesired impurities according to the ion momentum to charge ratio (Mv/Q, where v is the velocity of the ion, Q is its charge, and M is its mass). Scanner magnet 18 then scans the ion beam in a direction perpendicular to the path of the beam. The scanning range is approximately 400 mm, dimension R in FIG. 3B. Following scanning, collimator magnet 20 reorients the ion beam such that the beam is parallel in the entire scan area.

Ion implanter 10 is sized to enable implantation on wafers that have a diameter of up to 300 millimeters. A wafer holder 26 holds wafer 24, at a selected angle within a range of angles of incidence of the beam to the wafer, preferably from normal incidence to the ion beam to less than 10°. In this embodiment, the ion beam is a ribbon shaped beam having a beam height (i.e. the length of the beam along a cross section of the beam) of 90 mm at the source and 60 mm at the wafer.

Figure 2:
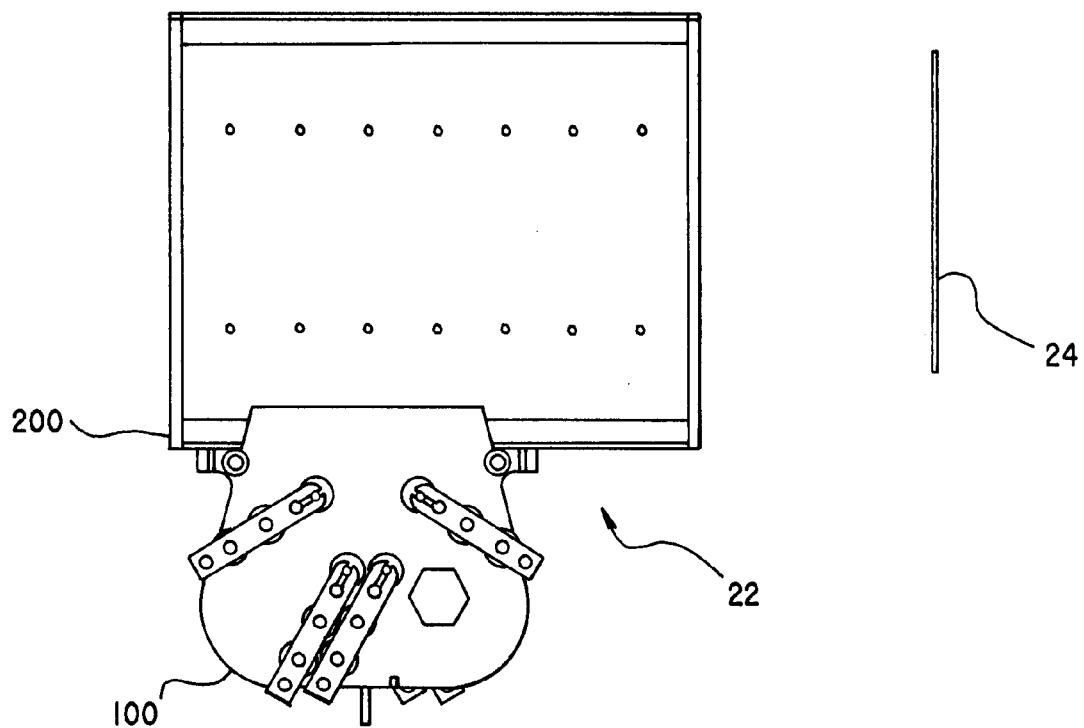
FIG. 2 is an end view of a plasma charge neutralizer of the invention showing its relative position with respect to the wafer and the drift tube.
Figure 3A:
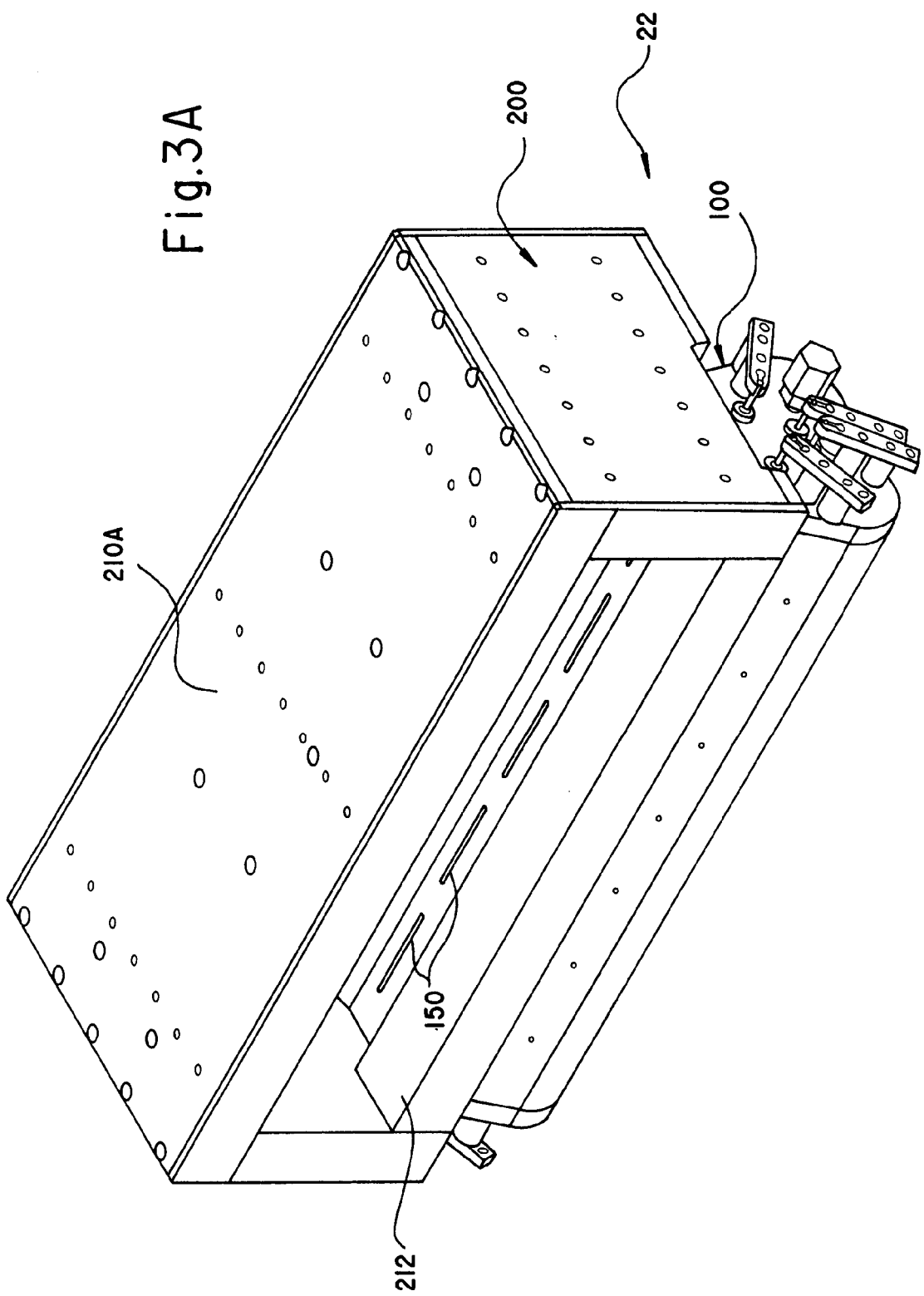
FIGS. 3A and 3B are upper and lower perspective views of the plasma charge neutralizer of FIG. 2 associated with the drift tube.
Figure 3B:
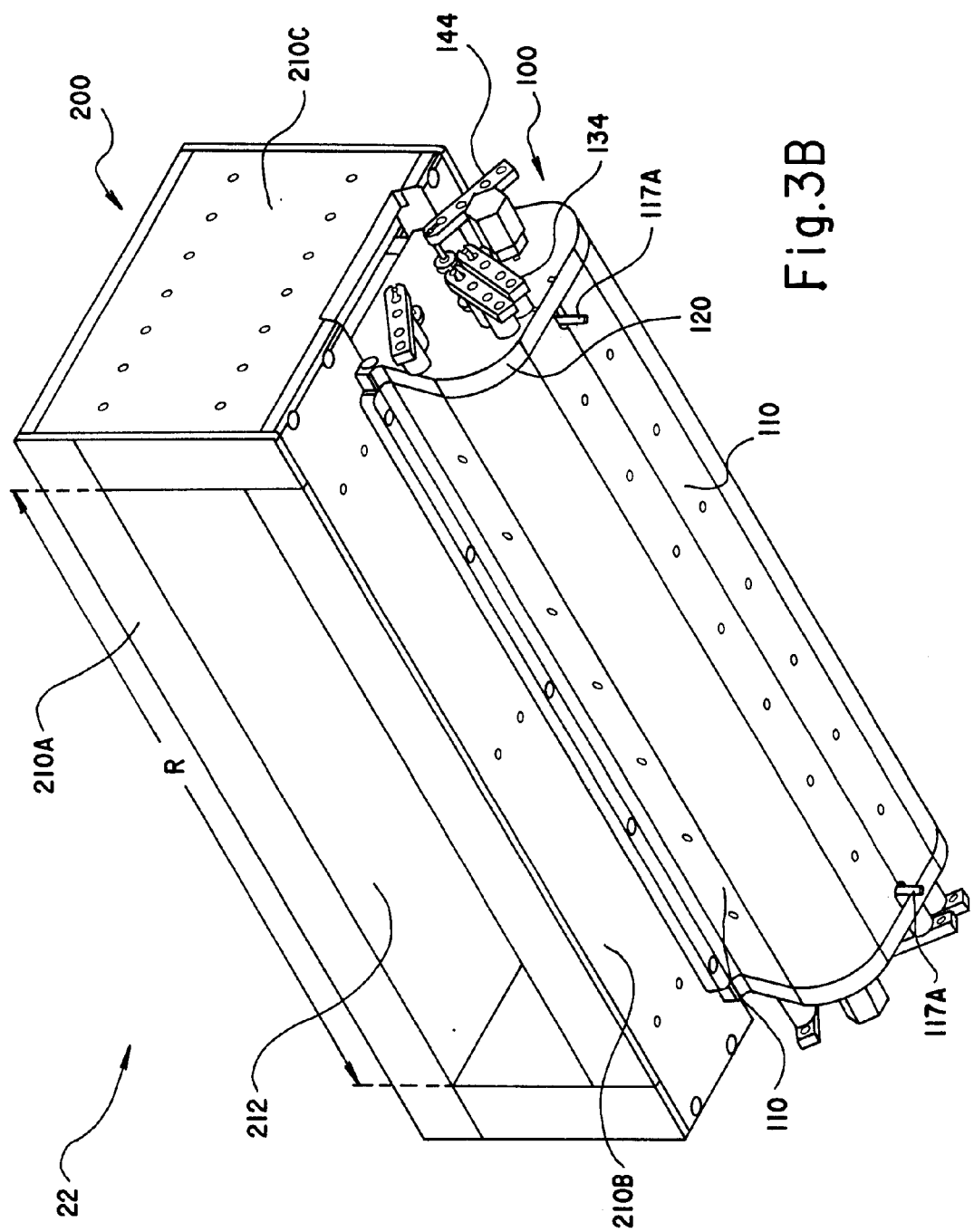
Figure 6:
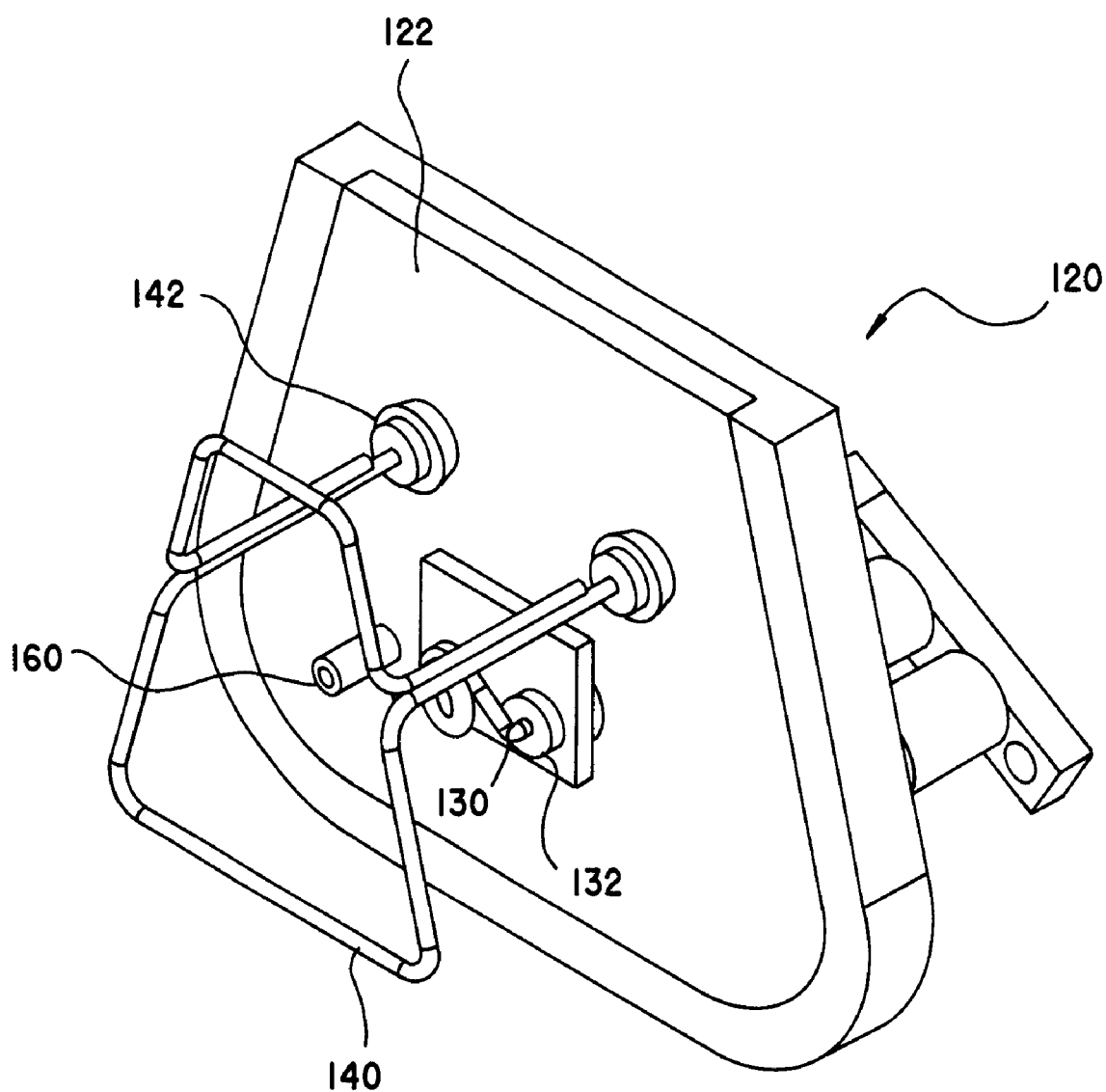
FIG. 6 is a perspective view of the end wall of a plasma source generating portion of the neutralizer of the preceding figures.

FIG. 2 shows the relative position of a certain embodiment of the plasma charge neutralizer 22 to wafer 24. Referring also to FIGS. 3A and 3B, this certain embodiment of plasma charge neutralizer 22 is composed of two components: a plasma source 100 and a plasma guide or drift tube 200. We will first describe the structure of plasma source 100 of this certain embodiment with reference to FIGS. 2–7A and 9. We will then describe the structure of drift tube 200 of this certain embodiment with reference to FIGS. 3A–3B and 8–9.

As to plasma source 100, referring to FIGS. 2–7A, plasma source 100 has an elongated plasma chamber defined by three side walls 110 and two end walls 120. Plasma source 100 has a generally trapezoidal cross section, with its narrow end connected to drift tube 200. Plasma source 100 is coextensive with the scanning range and therefore can deliver plasma to the entire the scanning range of the beam.

Each end wall 120 also has a cathode 130 and a corresponding anode 140 installed on it (best seen in FIG. 6B). In some embodiments, the cathode filament may be made up of coiled tungsten wire in a pig tail format. Anode 140, is installed on insulators 142 so as to be insulated electrically from end wall 120. Cathode 130 is also similarly installed on insulators 132 and is insulated electrically from end wall 120. Cathode electrodes 134 and anode electrodes 144 allow the anode and cathode to be connected to power sources (not shown) during operation. Anode 140 is spaced from and generally surrounds cathode 130. Anode 140 is also spaced from walls.

Each end wall 120 also has a conductive graphite shield 122 that faces the inside cavity of plasma source 100. This conductive shield is held at a potential close to that of cathode 130 during operation. Because the potential difference between cathode 130 and shield 122 is small, no arcing occurs across insulators 132. Therefore, the possibility of flaking as a result of such discharge is reduced.

Side walls 110 have generally three layers: an outer wall 116; a series of magnets 114; and an inner shield 112 which protects magnets 114 from plasma deposits. Because the plasma source has a trapezoidal cross-section, magnets are installed on only three walls, as opposed to embodiments having a rectangular cross-section which typically might have magnets installed on all four walls. In certain embodiments, inner shield 112 is constructed out of graphite or glassy carbon which is conductive but permeable to magnetic fields. During operation, shield 122 is grounded, that is kept at the same voltage as substrate and at a potential close to that of cathode.

Figure 7:
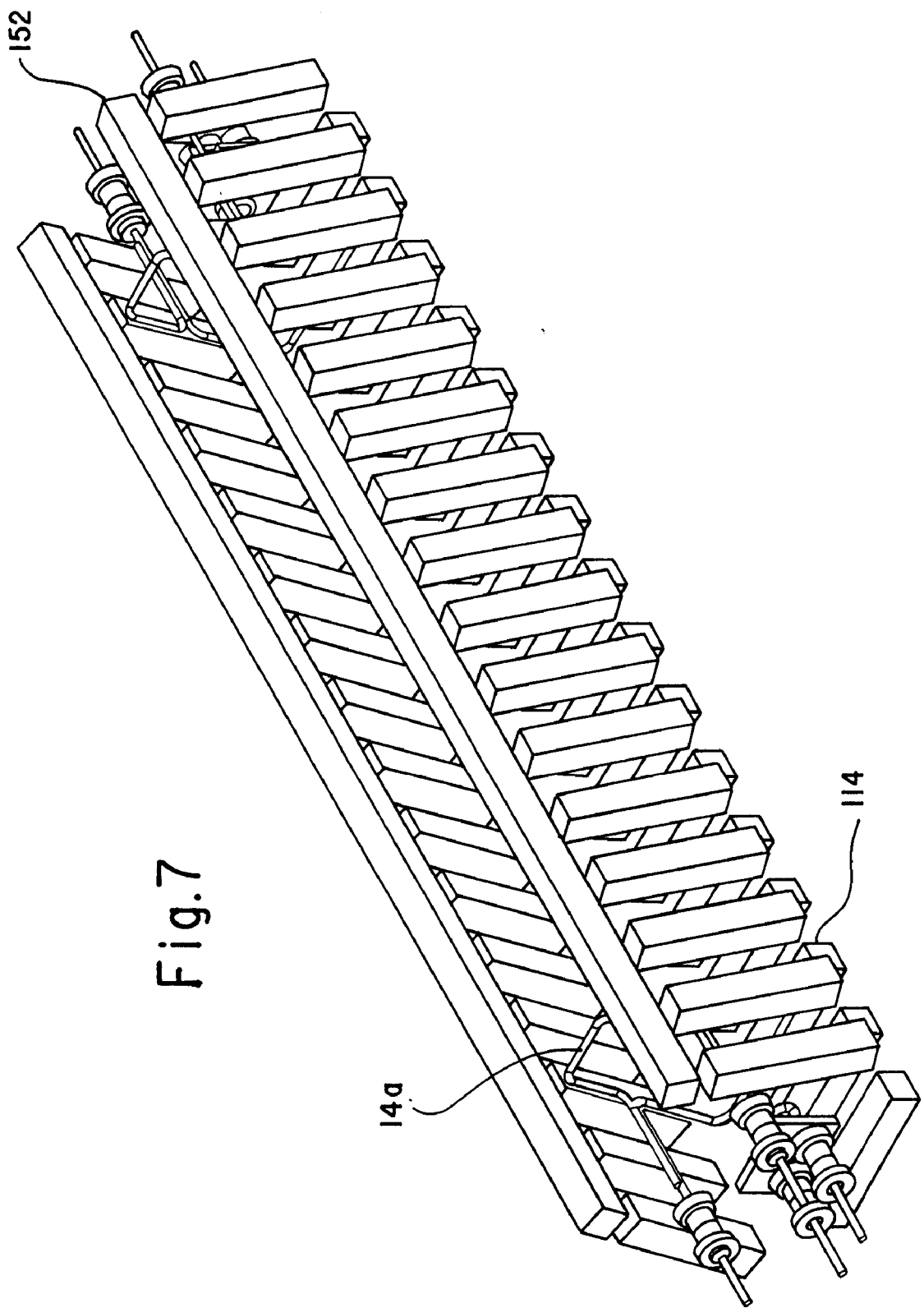
Figure 8:
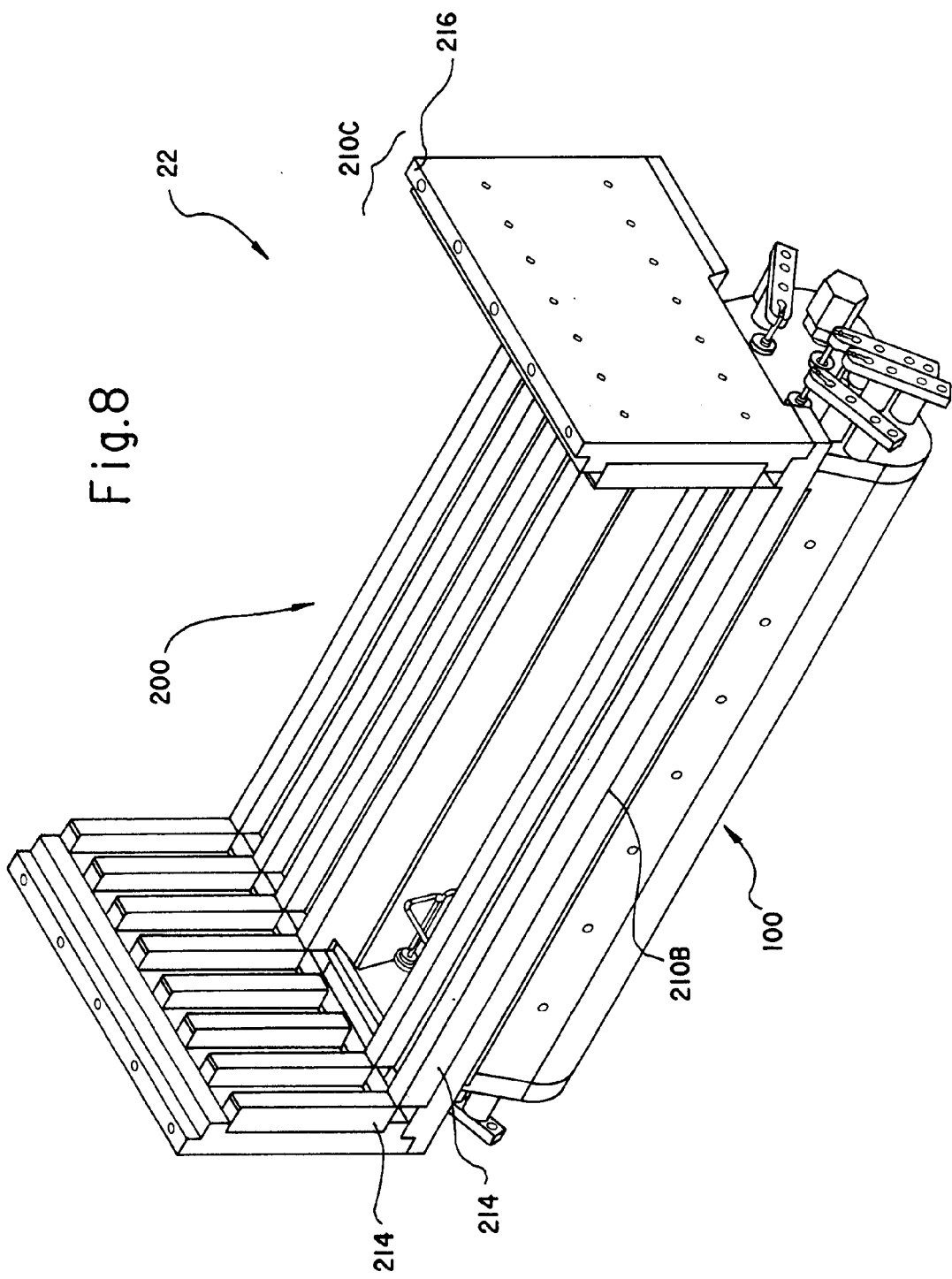
FIG. 8 shows the arrangement of magnets along walls of the drift tube.
Figure 9:
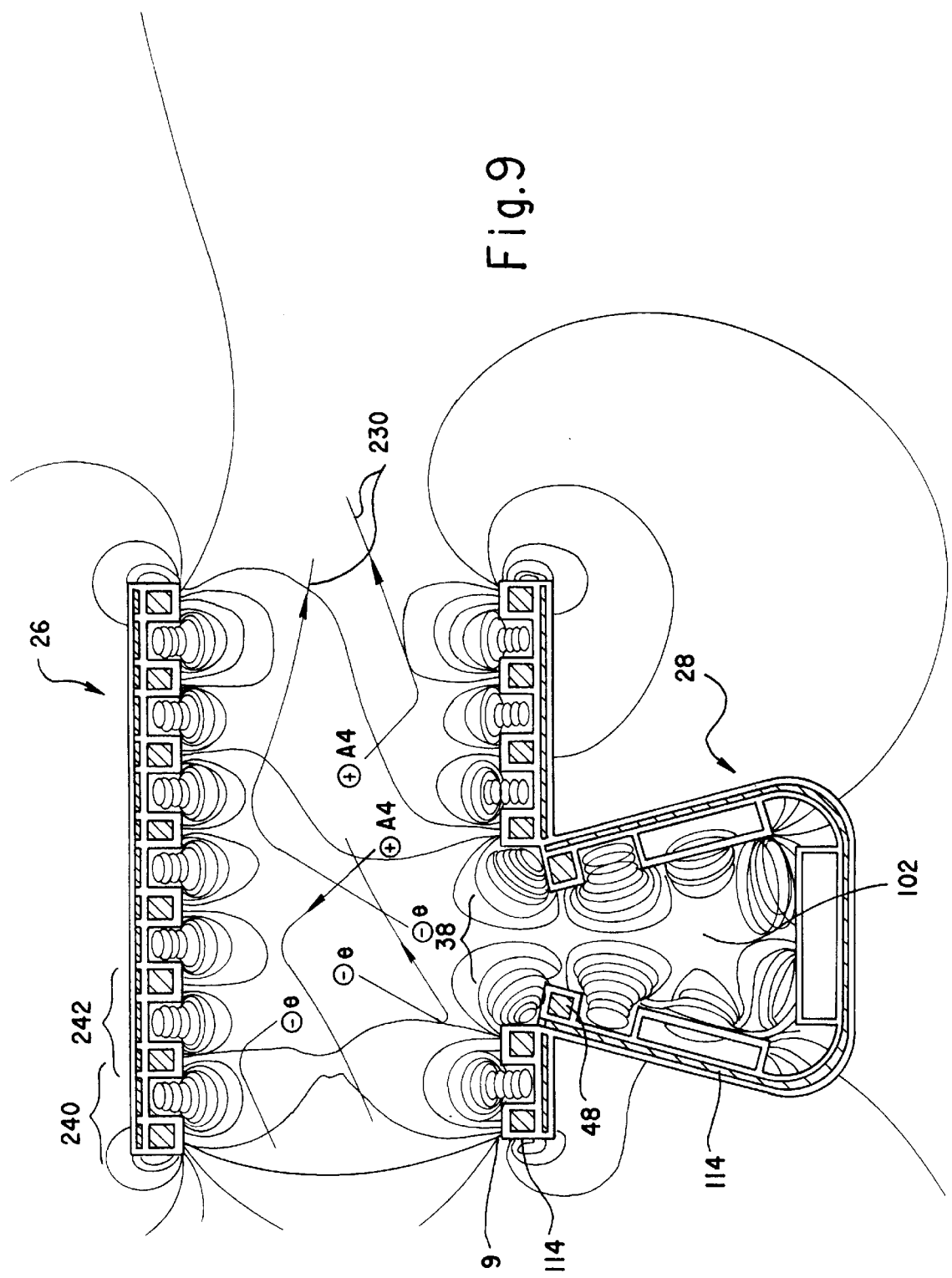
FIG. 9 shows a pattern of magnetic fields in the plasma source and the drift tube.

Magnets 114 are located between inner shield 112 and outer wall 116 and generally surround the chamber. In the described embodiment, there are 16 magnets on each side wall (FIG. 7). In some embodiments, each magnet has a magnetic field induction of 1.5 kGaus at the surface. The magnets are positioned such that each magnet has only one pole facing the chamber. They are also arranged so that adjacent magnets have alternating poles, i.e. N,S,N,S. Referring also to FIG. 9, this arrangement creates a relatively uniform cusped magnetic field (a magnetic trap), which generally has its strongest field density near the magnets and its weakest (nearly zero) at the center of the chamber. During operation, the magnetic field contains the plasma in a central region 102 (FIG. 9) of the source, which is generally the area surrounding an axis that connects the two cathodes 130. Anodes 140 are located near magnets 114 so as to be near the strongest segment of the magnetic field (location of the anodes relative to the magnets is best seen in FIG. 7A in which some of the magnets are removed to show one of the anodes). The magnetic field therefore assist with preventing the plasma from reaching anodes 140.

In some embodiments, each magnet 114 is an assembly of three components: a first ferromagnetic plate, a permanent magnet, and a second ferromagnetic plate. The first magnetic plate is disposed between the permanent magnet and outer wall 116. The second ferromagnetic plate is attached to the side of the permanent magnet that faces inside of the source. These ferromagnetic plates, which may be made out of soft iron, have a high magnetic permeability ($\mu$). The ferromagnetic plates concentrate and redistribute the magnetic flux of the permanent magnets. This concentration and redistribution performs a variety of functions. First, there may be fluctuations in the magnetism of the permanent magnet along its length. Therefore, the magnetic field of the permanent magnet may be non-uniform along the length of the pole. The ferromagnetic plates smooth out such non-uniformities and make the magnetic field of the whole assembly more uniform. In effect, the ferromagnetic plates act as filters. Second, the ferromagnetic plates cause the magnetic field of magnets 114 to be stronger than that of the permanent magnet. In some embodiments, the ferromagnetic plates increase the magnetic strength by two times. In essence, the ferromagnetic plates act as amplifiers to increase the strength of the magnetic field. Third, they limit the dispersion of the magnetic field outside the plasma source. In essence, they act as shields to prevent scattering of magnetic flux outside the source.

Outer wall 116 of plasma source 100 is cooled with water in order to maintain the temperature of side wall 110 below the temperature where the magnetism of magnets 114 degrades. Water runs through pipes 117 and is supplied to pipes 117 by two water feed lines 117A. The water source and temperature control mechanism is not shown or described and would be readily known to a person skilled in the arts.

Plasma source 100 also includes a gas feed nozzle 160 (FIG. 6) which is connected to a gas feed line connector 162 (FIG. 4) for attachment to a gas feed line and a gas source (not shown). In some embodiments, the gas source allows a gas flow that can be adjusted depending upon the plasma density required for a particular application. The range of flows can vary, for example, from 0–1.5 sccm. The required rate of flow for a particular application is typically determined experimentally during operation. In some embodiments, the required pressure in the source 100 for Argon is 0.0007 Torr, for Xenon 0.0003 Torr, and for Krypton 0.0005 Torr.

Plasma source 100 at its narrow end connects to drift tube 200. The plasma chamber (or inner cavity) of plasma source 100 opens to drift tube 200 via a piece-wise contiguous aperture 150 (FIG. 3). In other embodiment, the aperture may be a single continuous opening. (FIG. 4 shows a view of the source on the 100 plasma source without aperture 150.)

Generally, the gas pressure in drift tube 200 should be a fraction of the gas pressure in the plasma chamber. The increased gas pressure in the drift tube interferes with the ion beam. Therefore, it is preferable to keep the pressure in the drift tube within an acceptable range. However, in the plasma chamber, the pressure has to be higher than that in the drift tube so that ionization takes place efficiently. Preferably, the ratio of the gas pressure in drift tube 200 to the gas pressure in plasma chamber 100 should be less than 1/100 and more preferably less than 1/200th. The ratio of gas pressure in drift tube 200 to gas pressure in plasma chamber 100 is proportional to the ratio of the size of the aperture to the size of the opening of the gas chamber. This is because the size of the opening of the aperture determines how easily gas escapes the plasma source while the size of the opening of the drift tube determines how easily gas escapes the drift tube. Therefore, it is preferable that the ration of the two sizes be less than 1/100 (to obtain similar gas pressure ratio in the two structures) and more preferably less than 1/200. The size of the aperture also similarly affects the plasma density in the two structures.

Two magnets 12 traverse the entire length of aperture 150. In certain embodiments, each magnet has a magnetic field density of 1.5 KGaus at the surface. In some embodiments, each one of magnets 152 has a single pole disposed along the length of that magnet facing the other one of the magnets 152. Referring to FIG. 9, in some embodiments, the magnets may have the same polarity. Therefore, the magnetic field between magnets 152 is a cusped magnetic field, having an area 38 of low magnetic density in between magnets 152. This area in effect acts as a nozzle and limits the drift of plasma from the plasma chamber into drift tube 200.

Figure 9A:
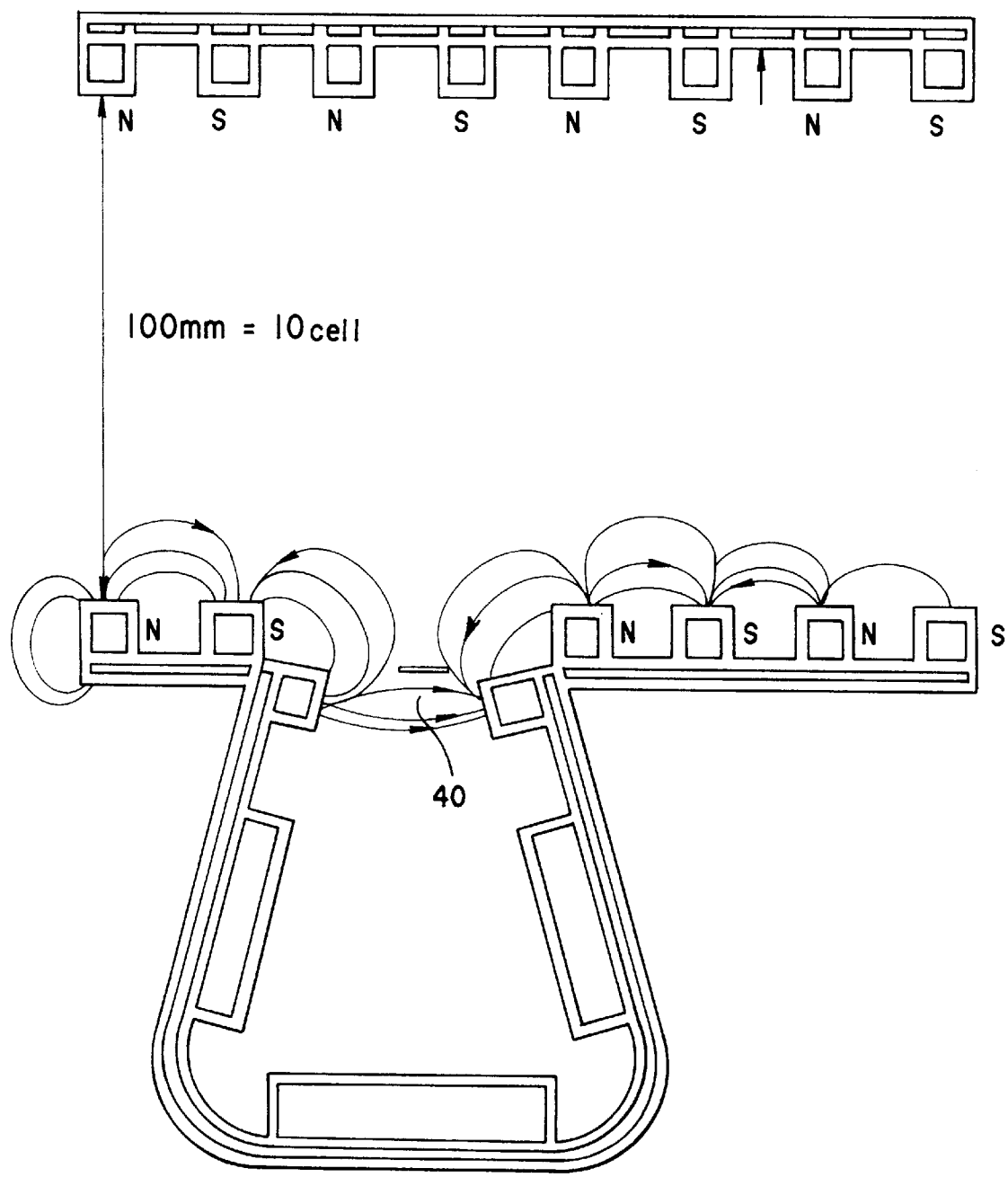
FIG. 9A shows a pattern of magnetic field at the plasma source aperture.

Referring to FIG. 9A, in some other embodiments, the poles of magnets 152 which face each other have opposite polarity. During operation, this arrangement results in a magnetic field 40 between the two magnets 152 to extend across the opening of the plasma chamber. This magnetic field acts to prevent primary electrons to from entering the chamber but allowing secondary electrons and plasma to drift into the chamber.

Referring to FIGS. 3A–3B and 7–8, we will now describe drift tube 200, an inner cavity of drift tube 200 in some embodiments extends 400 millimeters along the scan path, 100 millimeters long along the beam height and about 220 millimeters deep along the beam path. Drift tube 200 has four walls: a top wall 210A, a bottom wall 210B, and two side walls 210C. These walls define an open cavity, through which the ion beam passes before hitting the wafer. Each wall of drift tube 200 is constructed similarly to side walls 110 of plasma source 100, that is each wall has three components: a graphite shield 212 facing the cavity, a series of magnets 214, and an outer wall 216. Shield 212 is a conductive shield. During operation, shield 212 is grounded, that is kept at the same voltage as substrate and at a potential close to that of cathode. Shield 212 protects magnets 214 from being stricken by the beam or the plasma.

In the described embodiment, top wall 210A and side walls 210C have 8 sets of magnets 214 installed on their outer wall 216, while bottom wall 210B which is connected to the plasma chamber has 6 sets of magnets. In some embodiments, magnets 214 on the top and bottom walls 210A and 210B of the drift tube are approximately 400 mm in length, while magnets on the side walls 210C are 100 mm. In certain embodiments, these magnets may have a magnetic field density of 1.5 KGaus at their surface. These magnets may be constructed out of SmCo28 or NdBFe permanent magnets. They may have a 10×10 cm$^2$ cross section. Preferably, the integral of the magnetic field density of magnets 214 over distance away from the magnetic pole facing the inside of the drift tube (i.e. $\int B.dl$) is more than 1.4 kGaus cm. The value of $\int B.dl$ is proportional to the deflecting force the magnet can impose on heavy ions of the plasma. In some embodiments, with a 2.5 mm glassy carbon shield for shield 212, the $\int B.dl$ of magnets 214 having a field density of 1.5 kGaus at the surface of the magnet surpasses 1.4 kGaus cm.

The magnets on each adjacent wall are located such that they form a continuous magnet ribbon around the cavity (except for where aperture 150 is located, where the ribbon does not extend to the bottom wall). Magnets 214 are generally located perpendicular to the path of the beam. A north or a south pole of each of these magnetic ribbons faces the inner cavity of the drift tube. Furthermore, the magnetic ribbons are arranged such that the adjacent magnet poles along the beam path alternate, i.e. N,S,N,S,N,S. The spacing between the magnets depends on the beam energy, the species being implanted, and the plasma. In some embodiments, the magnets are spaced 20 mm from each other.

Magnets 214 create a cusped magnetic field (a magnetic trap) as shown in FIG. 9. This magnetic field is strongest near the side wall and nearly nonexistent in the center of the tube. This field is generally uniform and linear. This magnetic field contains the plasma which enters drift tube 200 from plasma source 100 near the ion beam by deflecting the plasma away from the walls toward the center of the drift tube cavity. In some embodiments, the magnets reflect the main portion of the plasma so that the plasma mainly resides within an area whose outside surface area is a fraction of the surface area of the walls defining the drift tube cavity. In some embodiments, this fraction can be as lows as $1/10$.

The operation of the device is as follows. A power supply (not shown) drives each of cathodes 130 with a current, e.g. 150 amps, causing the cathode to heat, e.g. up to about 2500° C. As cathodes 130 heat up, they begin thermionic emission of electrons. A second power source (not shown) holds each of anodes 140 at a positive potential relative to a corresponding cathode 130, which has a potential close to ground. In some embodiments, the potential can be varied between 20 v to 120 v. Generally, this voltage determines the energy level of the emitted electrons, so that for a nominal 30 v potential energy level of majority of electrons is approximately 20 ev. Therefore, the anode potential relative to the cathode is varied depending on the requirements of particular application.

Because of the potential difference between cathodes 130 and anodes 140, anodes 140 exert a force on the electrons and extract excited electrons. Moreover, as the electrons ionize the gas in the chamber to create a plasma, the ions in the plasma have a positive potential relative to ground. This positive potential is close to that of the anode. The plasma therefore further extracts electrons from cathodes 130. It should be noted that because plasma is at a potential close to that of the anode, electrons from the cathode are drawn more to the plasma since plasma appears as a large positive electrode to these electrons.

Generally, speed of an electron is proportional to the square root of the electron's energy level. That energy level is in turn determined by the extent to which electron is excited and the force with which the electrons is extracted. Typically, that energy level is proportional to the potential difference between the cathode and the anode, as described above. We will refer to these electrons as "primary electrons" in contrast to "secondary electrons" which are electrons dissociated from gas molecules in the plasma source as a result of collision typically with primary electrons.

Primary electrons will likely be emitted and extracted at such a speed from the cathodes that they escape the pull of the extracting anode and travel past them. Cathodes 130 and anodes 140, and the potential between them, together with the gas pressure in the source, determine the mean free path of electrons emitted by the cathodes. In some embodiment, the mean free path is approximately twice the length of plasma source 100.

Primary electrons ionize the gas molecules, typically argon (Ag) or Xenon (Xe), in the source by colliding with them and knocking off some of their electrons to create positive Argon or Xenon ions. The slow electrons knocked off by the primary electrons typically have a much lower energy than the primary electrons emitted or extracted from the cathode.

These two types of electrons, categorized by their energy levels, have properties that makes them useful inside the source and outside the source in different ways. Inside the source, primary electrons have a low probability of colliding with the gas molecules in the source, but when they do their energy level is high enough to ionize the molecules. Secondary electrons in turn have a high probability of colliding with gas molecules but do not have high enough energy to ionize the gas molecules. Therefore, primary electrons are mainly responsible for plasma production inside the source.

Outside the source, secondary electrons are more easily captured by the beam than primary electrons since the travel at a lower speed. Therefore, they better neutralize the beam. Moreover, because secondary electrons have low speed and energy level, they do not significantly charge the wafer surface since when they contact the surface, they do not knock off other electrons. Instead, they drift to the substrate surface to be absorbed and neutralize positive charge buildup on the surface. In contrast, because of their speed, primary electrons are not as easily trapped by the beam. They also more likely to strike the wafer surface with high enough energy to knock off electrons from the wafer surface so as to charge the wafer surface. Therefore, it is generally preferable to keep primary electrons contained in the source to increase plasma production and reduce charging of the wafer surface. In contrast, it is preferable to allow secondary electrons escape the source and enter the drift tube to neutralize the beam and the wafer surface.

We will now describe how the combination of the magnetic field generated by magnets 114 and 152 and electrical field generated by shield 122 work to achieve these two ends. We will describe how the combination increases the distance the electrons travel in the chamber and also prolongs the time to interact with the gas in the chamber, so as to increase the efficiency of plasma production.

Generally, the cusped magnetic field in the source prevents the primary electrons from reaching anode 140 directly. As previously described, the cusped magnetic field generated by magnets 114 surrounds anodes 140 close to the field's strongest region. Therefore, the electrons moving from cathodes 130 towards anodes 140 experience a force which pushes the electrons away from the anodes. The faster the electron, the stronger this force is. If the magnetic field exerts a deflecting force on an electron that is greater than the force with which anodes 140 pull the electron, the magnetic field will deflect that electron away from anodes 140. In general, magnets 114 are designed such that their cusped magnetic field deflects the majority of the extracted primary electrons away from the anode.

The plasma also works to in effect shield the anode. Because the plasma has a potential close to that of anode, it appears as a positive electrode or an anode to the electrons. Since the size of the anode is smaller than the plasma, more electrons travel towards the plasma than towards the anode.

It should be noted that the cusped magnetic field does not significantly deflect primary electrons which have lower energies—e.g. because of loss of energy in the chamber as a result of colliding—with gas molecules as strong a force as anodes 140 pull them. The cusped magnetic field therefore does not significantly prevent these electrons from being absorbed by anodes 140. In the case of secondary electrons knocked off gas molecules, these secondary electrons stay in the plasma because of the pull of positive ions and drift into the drift tube through the aperture with the plasma.

The deflected primary electrons may travel towards the end walls. However, since shields 122 of end walls 120 are maintained at a potential substantially that of the cathodes, they reflect electrons towards the middle of the chamber of plasma source 100. The electrical field of cathodes 130 also reflect the electrons to the middle of the chamber. The cusped magnetic field and inner shield 112 in turn deflect the electrons away from side walls 110. Therefore, collectively, the cusped magnetic field and electrical fields of the shields 112, 122 and cathodes 130 push the electrons towards the center of the central region 102 of plasma source.

As the anodes 140 in turn pull the electrons towards themselves and the electrical and magnetic field pushes the electrons away from the anode and the walls, the electrons that do not reach the anodes or the walls to be absorbed, travel back and forth, and all around, inside the central region 102 of plasma source. In essence, they oscillate between the two ends of the source and/or bounce around in central region 102. They therefore trace an extended path inside central region 102 of the chamber and interact with the neutral gas for a relatively extended period of time and ionize it. In this manner, the combined electrical and magnetic fields increase the ionizing efficiency of the chamber.

Because the electrons are reflected toward the center of plasma source as opposed to naturally gathering in the vicinity of the cathodes and the anodes, they tend to ionize the gas in the chamber along the whole length of the source. Therefore, the plasma production and resultant plasma can have a high degree of uniformity along the length of the source. When the plasma drifts out into the drift tube cavity, this plasma can effectively neutralize the beam along the length of the scanning area since the plasma may be uniform along the whole length. This uniformity increases as the plasma settles in the magnetic trap of drift tube 200.

Two magnets 152 at either side of aperture create a magnetic field that deflects primary electrons back into the plasma chamber. This deflection has two benefits. First, the primary electrons deflected back into plasma source 100 continue to ionize the gas. Therefore, magnets 152 further increase the efficiency of plasma ionization. Second, by preventing their release into plasma drift tube 200 and subsequently to the wafer 24, the probability of primary electrons charging the wafer is reduced.

The plasma that is generated in plasma source 100 is generally contained near central region 102 (i.e. center of the chamber of the ion source). The mechanism for confinement is similar to how electrons are deflected. The cusped magnetic field of magnets 114 deflect the low energy ions and electrons of the plasma away from side walls 110 and towards central region 102. The substantially trapezoidal cross-section of the three sides of plasma source 100 results in maintaining a coherent plasma density in central region 102. Because of deflection towards the center, the plasma has less opportunity to strike shields 122, 112 and generate contaminants. In the described embodiment, the use of graphite or glass carbon shield further reduces the possibility of contamination.

The plasma generated in the source drifts via aperture 150 into drift tube 200. Magnets 152 do not significantly prevent the plasma leaving the source. The plasma is made up of low energy electrons and positive ions much heavier than electrons. Since the particles in the plasma move slower than primary electrons, magnets 152 do not deflect them as strongly as they do the primary electrons.

In the drift tube, the arrangement of magnets 214 is such that magnets 214 create an effectively linear magnetic field on the walls of the drift tube with very little fluctuation in the magnetic field density along the walls. The cusped magnetic field prevents the plasma ions from being absorbed into the wall since the cusped magnetic field deflects the plasma ions into the central cavity of drift tube 200. The field therefore keeps the plasma ions, in close contact with the beam in the scanning area so that the beam can easily trap the low energy electrons of the plasma, which electrons then may neutralize the space charge of the beam. The cusped magnetic field by concentrating the plasma close to the beam path also can create a dense plasma while at the same time reducing the amount of plasma required for such density. In this way, the magnetic field can also prevent the plasma from recombining at shield 212 of the drift tube. Without such prevention, a larger proportion of such non-ionized gas may be lost to the vacuum and the gas pressure in the implanter can rise. The magnetic field can also prevent the plasma from generating contaminants by preventing the plasma striking shield 212. In the described embodiment, use of graphite or glassy carbon shield further reduces the possibility of contamination since these materials have a low propensity for generating contaminant when struck by the plasma.

Moreover, this cusped magnetic field deflects the ions and electrons in the plasma towards the wafer. Examples of paths 230 of ions and electrons are shown in FIG. 9. In this way plasma fills the gap between the drift tube and the wafer and interacts to neutralize the charge built up on the surface of the wafer. It should be noted that because these ions and electrons are low energy electrons, they will not implant in the wafer but only neutralize the charge on the surface.

Plasma ions typically have non-negligible mass that give them momentum (or inertia). Magnets 214 generally have sufficiently high magnetic field density to deflect the ions away from the walls. However, high field density of magnets 214 can cause the beam to deflect from its normal path. This is especially the case for low energy beams where the propensity to deflect the beam is higher than it is for high energy beams. This deflection can lead to channeling problems on the wafer, since the angle of incidence of the beam may change from a desired optimal angle.

Therefore, magnets 214 are arranged to minimize this effect. Adjacent magnets are arranged to have alternating poles, as described above. Because the magnets are of the same strength, any deflection of the beam by the magnetic field of one pair of adjacent magnets (e.g a pair of magnets 240 in FIG. 9) may be neutralized by an equal but opposite deflection by an adjacent pair of magnets (e.g. a pair of magnets 242 in FIG. 9). This arrangement can neutralize the divergence in the beam path that may be caused by any one of the magnets.

To achieve the best plasma containment and least deflection of the beam, the strength and spacing of the magnets may be optimized. The strength and spacing of the magnets generally depend on the type of ion being implanted, the ion energy, and the type of gas used for the plasma. The spacing and strength may be optimized for lowest energy beam that can be used in ion implanter 10 (in some embodiments, 3 KeV), because the effect of the magnets are the greatest on low energy beam.

Figure 10:
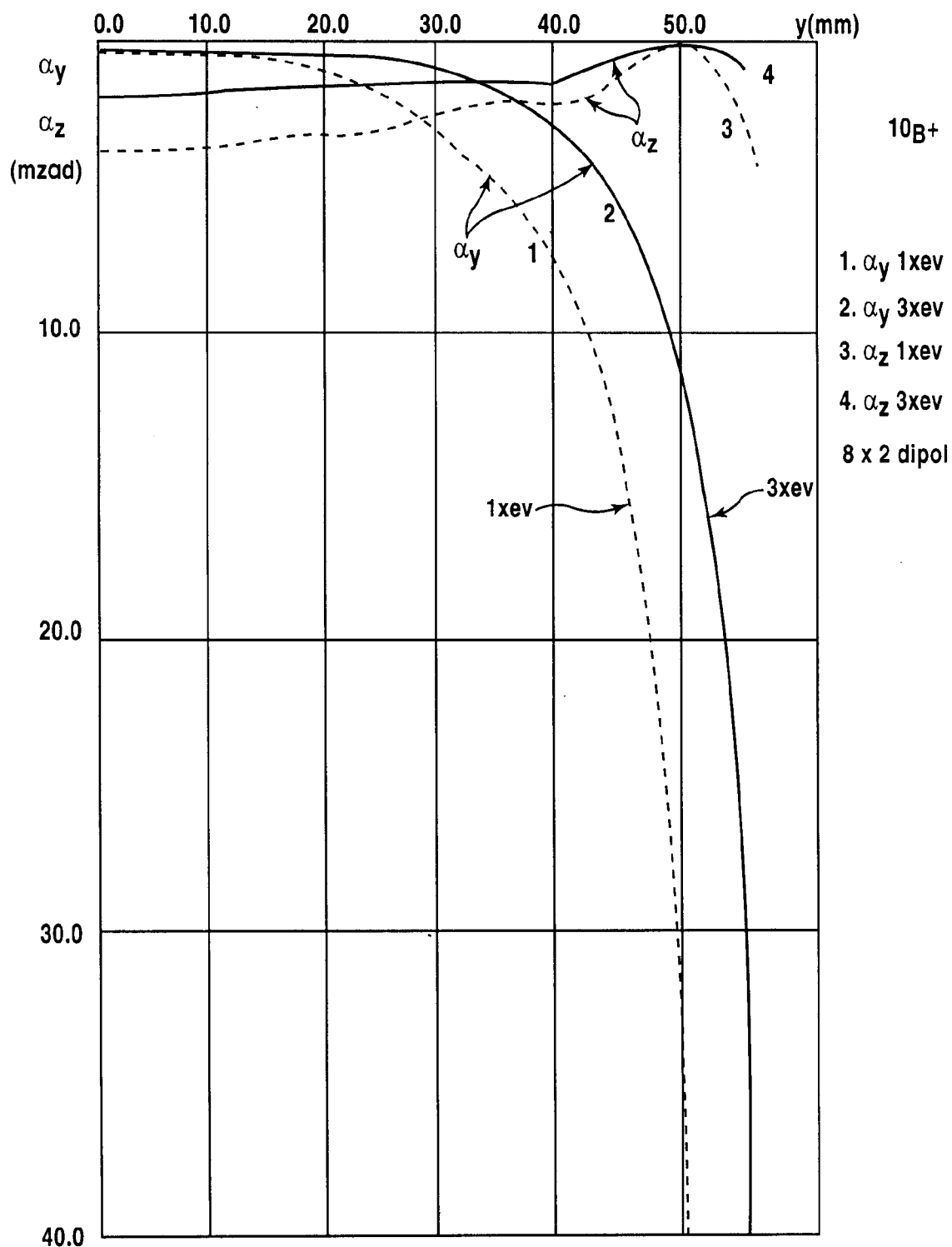
FIG. 10 shows results of a simulation of the operation of a drift tube according to features of the invention;.

FIG. 10 are graphs showing the general performance of the drift tube based on the results of a simulation of the operation of the drift tube. The simulation assumed a scanning path of 400 mm for 1 keV and 3 keV $B_{10}^+$ ion beams, with 8 lines of 1.5 kGaus magnets. Although different embodiments can be configured and operated differently, the graph 10 generally demonstrates the effect of the drift tube on the path of an ion beam. Graph $\alpha_y$ represents deflection of the beam in milliradions (y-axis) relative to the distance of the beam from the center in millimeters (y-axis). Graph $\alpha_z$ is the deflection angle along the scanning path while graph $\alpha_y$ is the vertical deflection angle perpendicular to the scanning path. FIG. 10 shows, for example, that the deflection angle $\alpha_y$ is less than 20 milliradions when the beam is 10 mm from the magnet at the entrance of the drift tube for a 3 keV B+ ion beam.

Other embodiments are within the scope of the following claims.

Figure 11:
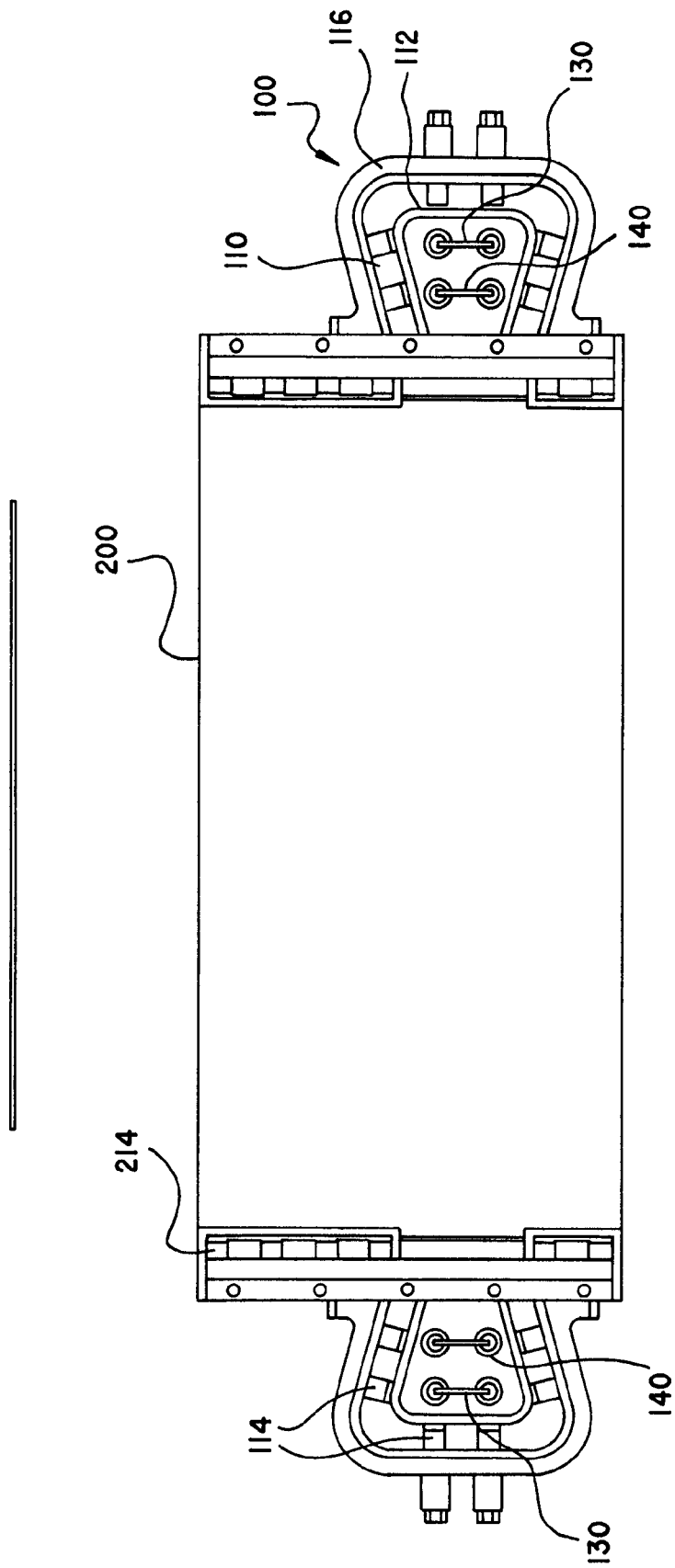
FIG. 11–13 show an alternative embodiment of a plasma charge neutralizer.
Figure 12:
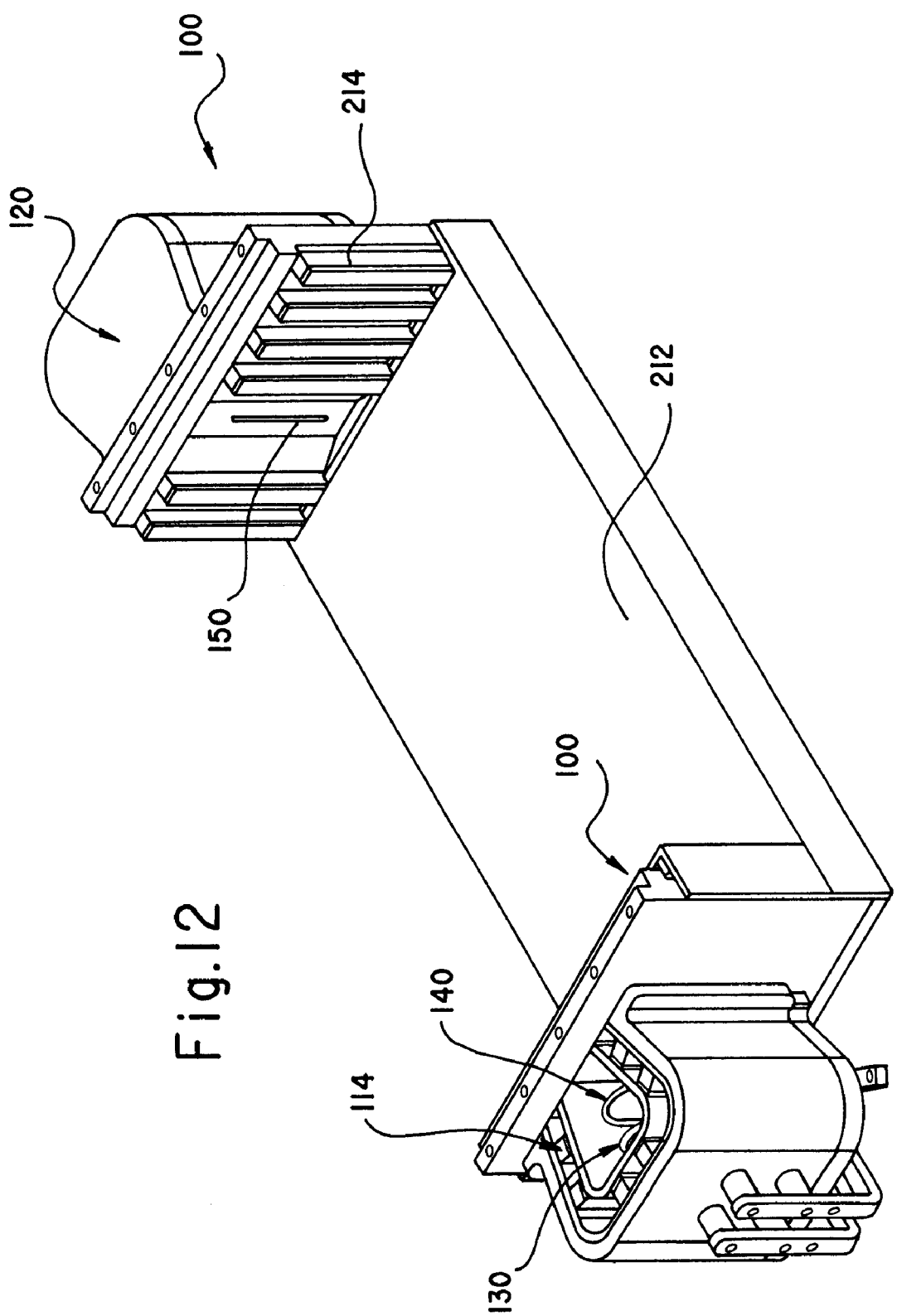
Figure 13:
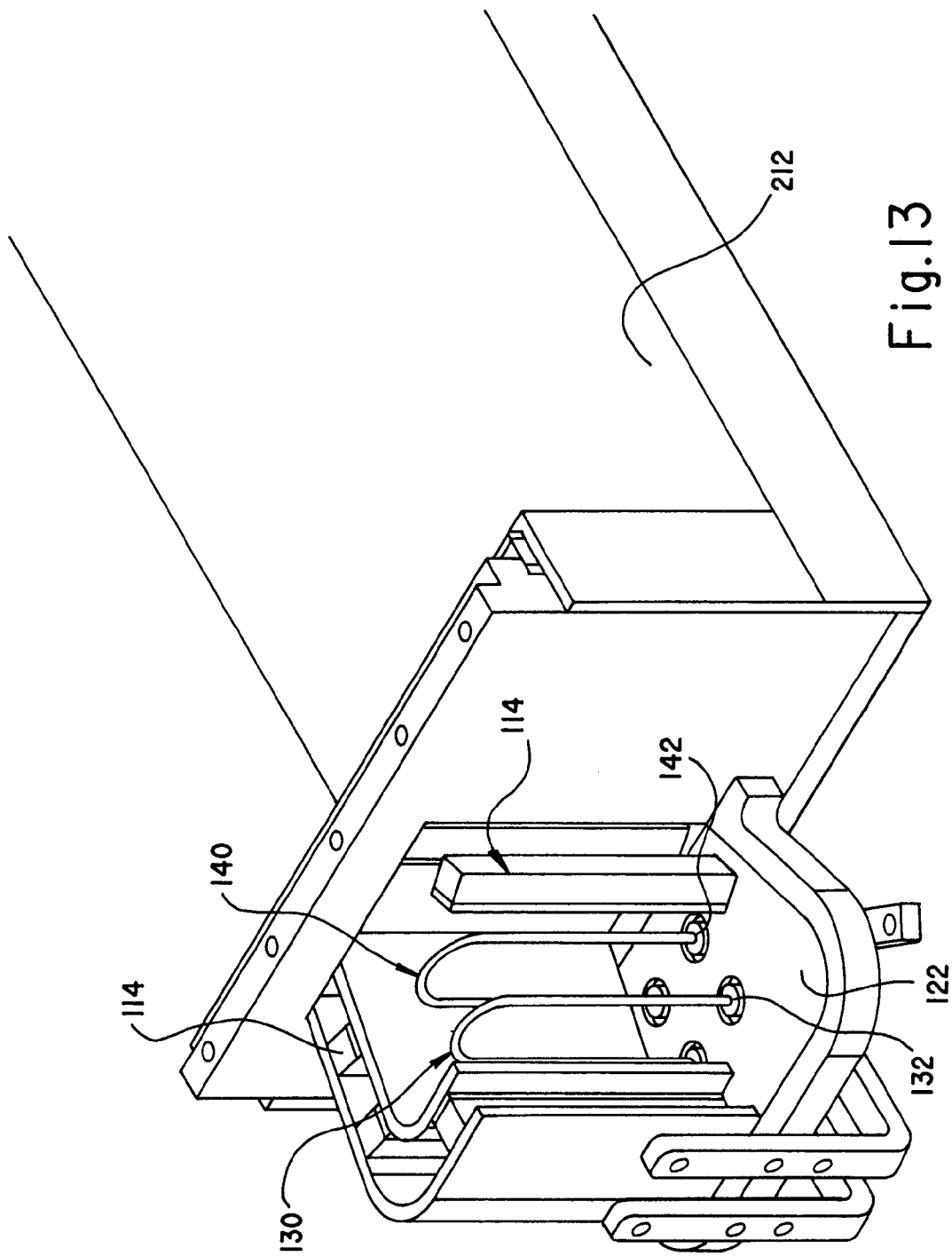

For example, FIGS. 11–13 show another embodiment of a plasma charge neutralizer. In describing this embodiment, we will use the same reference numerals for the component parts as those used in the above embodiment.

In each of plasma sources 100, in contrast to first described embodiment above, a cathode 130 is positioned opposite aperture 150, along the discharge axis of the source. An anode 120 is positioned along the same axis and closer to aperture 150. Side walls 110 have magnets 114. End walls 120 are also constructed in the same manner as the first described embodiment. Magnets 114 are arranged to have alternating poles, and the pattern follows that of the drift tube, i.e. poles are arranged as alternating N—S—N—S. The position of the anode places it close to magnets 114 and the strongest point of their magnetic field. A graphite shield 112 protects the magnets from plasma in the chamber.

Operation of the sources follows the same principles as the previously described embodiment above. Briefly stated, a power supply drives cathode 130 so that it is heated to a temperature to thermionically emit electrons. Electrons emitted from the cathodes are primary electrons. Positively charged plasma and anodes in the source extract more primary electrons from the heated cathodes. These primary electrons interact with the neutral gas to ionize it and create the plasma. A combination of a cusped magnetic field of magnets 114 and electrical field of shields in the plasma source prevents these primary electrons from being absorbed by the anode and the walls of the source. Magnets 152 along aperture 150 specifically prevent high energy electrons from escaping into the drift tube. As a result, the primary electrons oscillate in the central region of the plasma source, effectively tracing an extended path to interact for a prolonged time with the neutral gas. This prolonged interaction increases the efficiency of plasma production.

The plasma, consisting of low energy electrons and low energy positive ions, generated in the source drifts through aperture 150 into a drift tube. A magnetic trap provided by a cusped magnetic field in drift tube 200 contains this plasma in close proximity to the beam. Some of the low energy electrons and positive ions are then trapped in the beam and tend to neutralize the overall potential of the beam. The magnetic trap tends to maintain the density of the plasma to reduce the pressure-rise effects of the plasma on the vacuum environment in the ion implanter. Furthermore, the magnetic trap of the drift tube reflects the low energy electrons and positive ions toward the wafer so that any charge build up on the wafer can be neutralized. The cusped magnetic field of the magnetic trap is provided in a pattern that minimizes the deflection of the beam due to the magnetic field itself, as in the case of the embodiment described above.

Figure 14:
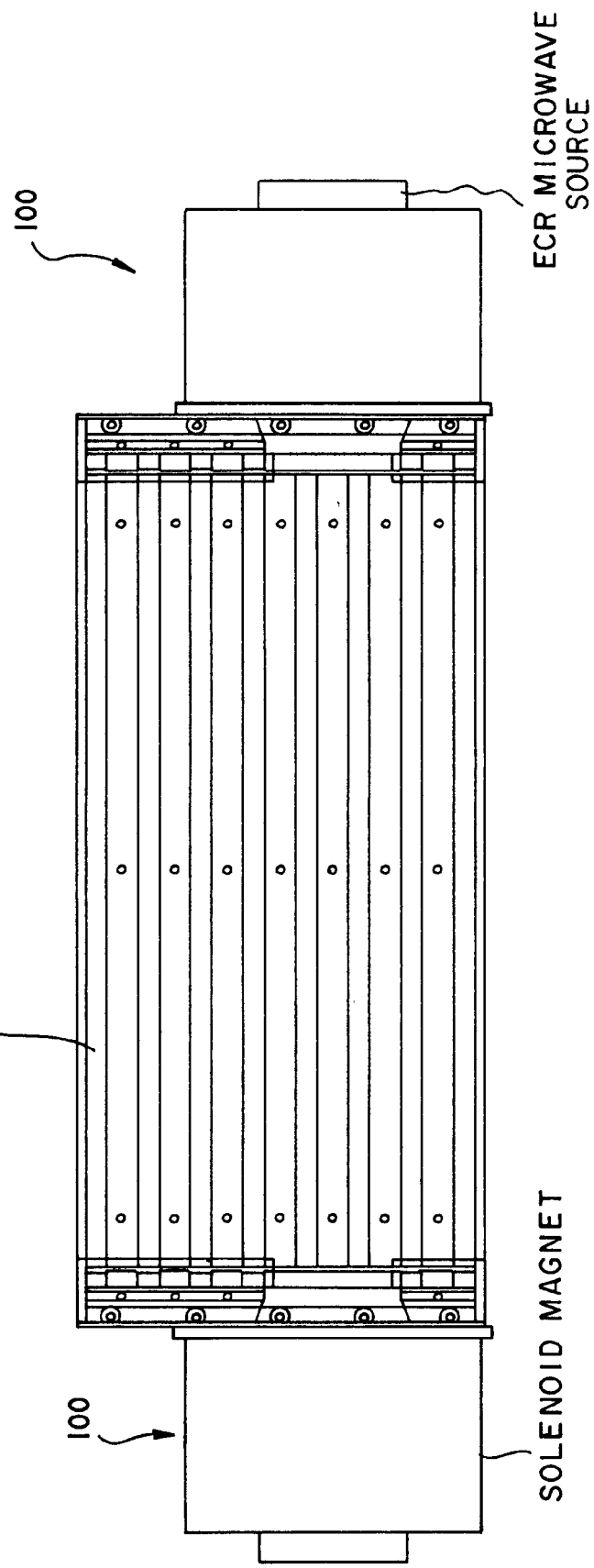
FIG. 14 shows another embodiment of a plasma charge neutralizer.

FIG. 14 shows another embodiment of a plasma charge neutralizer in which electron cyclotron resonance (ECR) plasma sources 320 replace the previously described plasma sources 100. In FIG. 14, the same reference numerals are used to refer to the same component parts as those used in the above embodiments. The operation of typical ECR sources appear in U.S. Pat. No. 5,189,446 by Barnes, issued Feb. 23, 1993, the patent and the referenced publications therein incorporated herein by reference. In this embodiment, ECR sources 320 generate the plasma which then neutralizes the ion beam.

FIG. 15 shows another embodiment of a plasma charge neutralizer in which plasma sources 100 are tilted relative to the drift tube and a path of the beam. In describing this embodiment, we will use the same reference numerals for the component parts as those used in the above embodiment. In this embodiment, discharge axes 300 of plasma sources 100 are tilted towards wafer 24. A discharge axis defines a general direction along which the plasma discharges from the plasma source. In the case of this embodiment, the discharge axis is at an angle with the beam path, and preferably tilted toward wafer 24. In the previously described embodiment above, the axis was perpendicular to beam path.

FIG. 16 generally shows the performance of a plasma charge neutralizer based on the results of simulation of design with two tilted chambers with only one chamber operating. Although different embodiments can be configured and operated differently, FIG. 16 is useful for demonstrating generally the movement of plasma during operation of a tilted chamber embodiment. The results of the simulation show that the plasma preferentially drifts towards the wafer concentrating in area 310. The angle of the tilt of the chamber may be determined based on experimental or operational results in order to optimize the drift of the plasma towards the surface, the life and purity of the plasma, ion beam deflection, primary electron suppression at the source, beam neutralization, and beam deflection.

Any of the previously described sources can be used in tilted configurations. Further, in other alternative embodiments, additional plasma sources may be used in both tilted and non-tilted configurations. The sources may be placed facing one another, side by side, or in other configurations. Moreover, in the case of the tilted chamber configuration, one embodiment may include only one tilted chamber.

What is claimed is:

1. An ion implanter for implanting ions in a workpiece, comprising
    apparatus for generating an ion beam and directing it toward a surface of a work piece, and
    a plasma generator for generating plasma to neutralize the ion beam and the work piece surface, the plasma generator comprising
        a plasma generator chamber defined by walls,
        a relatively narrow outlet aperture for plasma produced in the chamber to leave the chamber to neutralize the beam and work piece surface,
        at least one cathode,
        at least one anode spaced from the cathode and from the walls of the chamber,
        magnets arranged within the plasma generator chamber, adjacent the chamber walls to generate a magnetic field to deflect primary electrons emitted from the cathode from directly reaching the anode, and
        a conductive shield, positioned within the chamber between the anode and the magnets, the shield having an electric potential selected to deflect electrons, the magnetic field and the conductive shield effective during operation to cause electrons from the cathode to trace extended paths to ionize gas within the chamber to generate plasma before reaching the anode.

2. The ion implanter of claim 1, for use with a scanned ion beam, the chamber and its outlet aperture being elongated and arranged across a scanned path of the beam.

3. The ion implanter of claim 1 wherein the apparatus for generating and directing the ion beam includes a magnetic scanner.

4. The ion implanter in claim 3, wherein the ion beam is a high energy beam.

5. The ion implanter of claim 1, wherein the cathode is a spiral coil.

6. The ion implanter of claim 1, wherein the anode is in a generally surrounding relationship with the cathode.

7. The ion implanter of claim 6, wherein the ion implanter further comprises a second anode and cathode.

8. The ion implanter of claim 7, wherein the magnets of the plasma generator generate a magnetic cusp field that generally contains the plasma along an axis connecting the cathodes.

9. The ion implanter of claim 1, wherein the chamber comprises a wall onto which the cathode is mounted, the wall having substantially the same potential as the cathode so as to deflect electrons from the wall.

10. The ion implanter of claim 1 further comprising other magnets surrounding the relatively narrow outlet aperture, the other magnets creating a magnetic field for preventing primary electrons from leaving the chamber.

11. The ion implanter of claim 1, wherein the chamber has a generally trapezoidal cross-section, the relatively narrow outlet aperture being located at a narrow end of the trapezoid.

12. The ion implanter of claim 11, wherein the relatively narrow outlet aperture is a discontinuous slit.

13. The ion implanter of claim 11, wherein two magnets are located at either side of the relatively narrow outlet aperture, the two magnets creating a magnetic field for preventing primary electrons from leaving the chamber.

14. The ion implanter of claim 1, wherein the chamber comprises a wall opposing the cathode, and the magnets comprise a series of linear magnets disposed in parallel and inside of the chamber walls, a side facing inside the chamber and an opposing side facing outside having opposite polarity, the adjacent magnets being of opposite polarity, the magnets being sized and arranged in a pattern along the tube to create a magnetic field that generally contains the plasma along an axis between the cathode and the opposing wall.

15. The ion implanter of claim 14, wherein a second anode and cathode is positioned on the opposing wall.

16. The ion implanter of claim 1, wherein the chamber walls are cooled.

17. The ion implanter of claim 16, wherein the chamber walls are water-cooled.

18. The ion implanter of claim 1 further comprising
a drift tube defined by walls through which the ion beam passes before reaching the workpiece, wherein the aperture opens into the tube, and
a series of parallel, linear magnets positioned perpendicular to the general path of the ion beam, the magnets having a side facing the beam and an opposing side facing away from the beam, the two sides of the magnets having opposite polarity, the adjacent poles of adjacent magnets being of opposite polarity, the magnets sized and arranged in a pattern along the tube to create a magnetic field that prevents the plasma from reaching the walls of the drift tube and to enable any deflection of the ion beam produced by one magnet pole to be substantially neutralized by the successive magnet pole of the next adjacent downstream magnets.

19. The ion implanter of claim 18, wherein the drift tube has generally a rectangular cross-section.

20. The ion implanter of claim 18, wherein the drift tube allows for a beam scanning path in order of 40 cm.

21. The ion implanter of claim 1, wherein the conductive shield is constructed from graphite.

22. The ion implanter of claim 1, wherein the plasma generator is tilted relative to a general path of the beam.

23. The ion implanter of claim 1, wherein the plasma generator is characterized by a discharge axis defining an axis of discharge of plasma from the plasma generator and the discharge axis is perpendicular to a general path of a beam.

24. The ion implanter of claim 1, wherein the plasma generator is characterized by a discharge axis defining an axis of discharge of plasma from the plasma generator and the discharge axis is at an angle to a general path of a beam.

25. The ion implanter of claim 24, wherein the discharge axis is tilted toward the wafer.

26. The ion implanter of claim 1, for use with a scanned ion beam, wherein the chamber and its outlet aperture are arranged perpendicular to a scanned path of the beam.

27. The ion implanter of claim 26, further comprising
a drift tube defined by walls through which the ion beam passes before reaching the workpiece, wherein the aperture opens into the tube, wherein the drift tube has generally a rectangular cross-section and the chamber and its outlet aperture are arranged along a short side of the drift tube.

28. The ion implanter of claim 27 further comprising a series of parallel, linear magnets positioned perpendicular to the general path of the ion beam, the magnets having a side facing the beam and an opposing side facing away from the beam, the two sides of the magnets having opposite polarity, the adjacent poles of adjacent magnets being of opposite polarity, the magnets sized and arranged in a pattern along the tube to create a magnetic field that prevents the plasma from reaching the walls of the drift tube and to enable any deflection of the ion beam produced by one magnet pole to be substantially neutralized by the successive magnet pole of the next adjacent downstream magnets.

29. A plasma generator for generating plasma to neutralize an ion beam and a work piece surface, the plasma generator comprising
a plasma generator chamber defined by walls,
a relatively narrow outlet aperture for plasma produced in the chamber to leave the chamber to neutralize the beam and work piece surface,
at least one cathode,
at least one anode spaced from the cathode and from the walls of the chamber,
magnets arranged within the walls to generate a magnetic field that deflects primary electrons emitted from the cathode from directly reaching the anode, and
a conductive shield, positioned within the chamber between the anode and the magnets, the shield having an electric potential selected to deflect electrons, the magnetic field and the conductive shield effective during operation to cause electrons from the cathode to trace extended paths to ionize gas within the chamber to generate plasma before reaching the anode.

30. An ion implanter for implanting ions in a workpiece using a magnetically scanned ion beam, comprising
apparatus for generating an ion beam and directing it toward a surface of a work piece,
a plurality of magnets to focus and scan the ion beam in a first direction, a workpiece holder to hold the workpiece and to move the workpiece in a second direction substantially perpendicular to the first direction, a plasma generator for generating plasma to neutralize the ion beam and the work piece surface, the plasma generator comprising a chamber defined by walls, a relatively narrow outlet aperture for plasma produced in the chamber to leave the chamber to neutralize the beam and work piece surface, at least one cathode, at least one anode spaced from the cathode and from the walls of the chamber, magnets arranged within the plasma generator chamber, adjacent to the chamber walls to generate a magnetic field to deflect primary electrons emitted from the cathode from directly reaching the anode, and a conductive shield, positioned within the chamber between the anode and the magnets, the shield having an electric potential selected to deflect electrons, the magnetic field and the conductive shield effective during operation to cause electrons from the cathode to trace extended paths to ionize gas within the chamber to generate plasma before reaching the anode, a drift tube defined by walls through which the ion beam passes before reaching the workpiece, wherein the aperture opens into the tube, and a series of parallel, linear magnets positioned perpendicular to the general path of the ion beam, the magnets having a side facing the beam and an opposing side facing away from the beam, the two sides of the magnets having opposite polarity, the adjacent poles of adjacent magnets being of opposite polarity, the magnets sized and arranged in a pattern along the tube to create a magnetic field that prevents the plasma from reaching the walls of the drift tube and to enable any deflection of the ion beam produced by one magnet pole to be substantially neutralized by the successive magnet pole of the next adjacent downstream magnets.

* * * * *